(12) United States Patent
Fujiwara et al.

(10) Patent No.: US 8,216,667 B2
(45) Date of Patent: Jul. 10, 2012

(54) TANTALUM CARBIDE-COATED CARBON MATERIAL AND PRODUCTION METHOD THEREOF

(75) Inventors: Hirokazu Fujiwara, Kanonji (JP);
Norimasa Yamada, Kanonji (JP);
Yoshihisa Abe, Kanonji (JP)

(73) Assignee: Toyo Tanso Co., Ltd., Osaka (JP)

( * ) Notice: Subject to any disclaimer, the term of this patent is extended or adjusted under 35 U.S.C. 154(b) by 1615 days.

(21) Appl. No.: 10/592,085

(22) PCT Filed: Feb. 7, 2006

(86) PCT No.: PCT/JP2006/302418
§ 371 (c)(1),
(2), (4) Date: Dec. 7, 2006

(87) PCT Pub. No.: WO2006/085635
PCT Pub. Date: Aug. 17, 2006

(65) Prior Publication Data
US 2012/0040172 A1    Feb. 16, 2012

(30) Foreign Application Priority Data

Feb. 14, 2005 (JP) .................. 2005-036838
Jun. 20, 2005 (JP) .................. 2005-179866
Sep. 2, 2005 (JP) .................. 2005-255744

(51) Int. Cl.
*B32B 3/06* (2006.01)
*B05D 3/02* (2006.01)

(52) U.S. Cl. ............ 428/307.3; 428/306.6; 428/310.5; 428/316.6; 428/318.4; 427/372.2

(58) Field of Classification Search ............ 428/306.6, 428/307.3, 310.5, 316.6, 318.4; 427/372.2
See application file for complete search history.

(56) References Cited

U.S. PATENT DOCUMENTS 5,360,638 A    11/1994    Lequertier

FOREIGN PATENT DOCUMENTS

| JP | 4-285068 | 10/1992 |
|---|---|---|
| JP | 5-238856 | 9/1993 |
| JP | 07-033567 | 2/1995 |
| JP | 10-236892 | 9/1998 |
| JP | 10-245285 | 9/1998 |

(Continued)

OTHER PUBLICATIONS

Supplementary European Search Report dated Apr. 15, 2009 in European Application No. EP 06 71 3560.
A. Sayir et al., "Carbon fiber reinforced hafnium carbide composite", Journal of Materials Science, vol. 39, No. 19, pp. 5995-6003, Oct. 1, 2004.

(Continued)

*Primary Examiner* — Hai Vo
(74) *Attorney, Agent, or Firm* — Wenderoth, Lind & Ponack, L.L.P.

(57) ABSTRACT

This invention provides a tantalum carbide-coated carbon material, which has excellent corrosion resistance to reducing gases and thermal shock resistance at high temperatures, and a process for producing the same. The tantalum carbide-coated carbon material comprises a carbon substrate and a coating film provided on the carbon substrate directly or through an intermediate layer. The coating film is formed of a large number of densely aggregated fine crystals of tantalum carbide. The diffraction line of the (220) plane of tantalum carbide shows the maximum diffraction intensity in an X-ray diffraction pattern of the coating film. More preferably, this diffraction intensity is not less than four times the intensity of a diffraction line showing the second highest diffraction intensity.

20 Claims, 9 Drawing Sheets

FOREIGN PATENT DOCUMENTS

| | | |
|---|---|---|
| JP | 2003-343623 | 12/2003 |
| JP | 2004-084057 | 3/2004 |
| JP | 2004-299932 | 10/2004 |
| WO | 94/28192 | 12/1994 |
| WO | 2004/009515 | 1/2004 |

OTHER PUBLICATIONS

R. Teghil et al., "Pulsed-laser deposition and characterization of TaC films", Applied Surface Science, vol. 86, No. 1-4, pp. 190-195, Feb. 1, 1995.

Z. Chen et al., "Phase composition and morphology of TaC coating on carbon fibers by chemical vapor infiltration", Thin Solid Films, vol. 516, No. 23, pp. 8248-8254, Oct. 1, 2008.

US 8,216,667 B2

TANTALUM CARBIDE-COATED CARBON MATERIAL AND PRODUCTION METHOD THEREOF

This application is a U.S. national stage of International Application No. PCT/JP2006/302418 filed Feb. 7, 2006.

TECHNICAL FIELD

The present invention relates to a tantalum carbide-coated carbon material and a production method thereof. More particularly, the present invention relates to a tantalum carbide-coated carbon material usable as a member of an apparatus for forming compound semiconductor single crystals such as SiC, GaN and the like, and a production method thereof.

BACKGROUND ART

Conventionally, CVD apparatuses such as MOCVD and MOVPE, MBE apparatus and the like for epitaxial growth have been used for the production of semiconductor single crystals such as Si, GaN, SiC and the like. For production of SiC, a sublimation method, an HTCVD method (high temperature CVD method) and the like, requiring a high temperature of not less than 1500° C., particularly not less than 1800° C., are often used. For production of these semiconductor single crystals, hydrogen, ammonia, hydrocarbon gas and the like are generally used as a carrier gas and a starting material gas.

Carbon materials undergo gasification reactions at a high temperature of not less than 800° C. due to ammonia and hydrogen gas and are converted to methane gas, thus resulting in the volume change and weight decrease. Volume change causes, for example, change in the resistance of heater, which in turn varies process temperature. Consequently, degradation of the quality of epitaxial growth layer is feared. In addition, it is feared that, due to the volume change, a contact surface of a susceptor retaining a crystal wafer with a wafer becomes rough, which in turn causes non-uniformity of the temperature distribution of wafer, thereby consequently causing a defective epitaxial growth layer. The reaction between a carbon material and a gas is further accelerated particularly at not less than 1000° C. In this case, the heater and susceptor are deteriorated extremely in a short time. To suppress methanation of carbon materials, composite materials obtained by coating carbon substrates with dense silicon carbide by the CVD method have been used as furnace inside materials such as susceptor, heater and the like. However, the gasification reaction of silicon carbideat begins at 1300° C., silicon carbide is gasified by hydrogen at a high temperature of not less than 1500° C. and corroded at a rate of 5-30 μm/h. As a result of the corrosion, the coating film of the susceptor contains cracks and delamination, which allow corrosion of inside carbon materials. At this point, gases such as $N_2$, $O_2$, $CO_2$ and the like remaining in the carbon materials are released and feared to be incorporated in the crystals for semiconductor devices. Such gases can be the cause of defective doping of the semiconductor device to be finally obtained.

The wafer surface sometimes becomes flawed during raising the temperature of single crystal wafer for crystal growth or cooling the wafer to room temperature after crystal growth. Such flaw can be caused by etching of the wafer surface by a carrier gas and the like or sublimation and dissociation of the atom on the wafer surface. Such flaws are not preferable since they degrade the properties of the device and increase the contact resistance. Recently, the development of the surface flaws has been decreased by accelerating the temperature rise rate and temperature decrease rate during crystal growth, in other words, shortening the time for temperature rise and temperature decrease. In some cases, moreover, a wafer may be produced in a short time by rapid temperature rise and rapid temperature decrease to simply improve production efficiency. Rapid temperature rise and rapid temperature decrease in this way gives rise to a new problem of delamination and cracks produced in a susceptor which is a part of an apparatus for forming a single crystal. This is because a considerable thermal stress is generated in the susceptor.

In the case of epitaxial growth of GaN, for example, a sapphire substrate is heated to 1200° C., and then cooled to room temperature. At this time, the temperature of the susceptor is rapidly risen and rapidly lowered. It is feared that cracks may occur in the coating film of the material of the susceptor due to the repeated temperature rise and the temperature decrease. Hydrogen gas and ammonia gas as carrier gases and starting material gases may penetrate into the inside of the susceptor through the cracks. The graphite materials that form the substrate of the susceptor are gasified by these gases, and the aforementioned undesired results are feared to be produced.

Therefore, to enhance the corrosion resistance of the heater, susceptor and the like, coating of carbon materials with a tantalum carbide layer has been tried. According to the disclosure of JP-A-10-236892 and JP-A-10-245285, a carbon material coated with a film formed by deposition of tantalum carbide fine particles by the AIP method affords heaters and susceptors that can be used longer than conventional ones. Moreover, the CVD method enables formation of a coating film of tantalum carbide, which is dense and superior in corrosion resistance. Therefore, a long-life carbon material is expected to be provided, since a coating film made of TaC having high crystallinity can be easily obtained by the CVD method. However, a coating film having high crystallinity, which is obtained by the CVD method, has a columnar structure and low flexibility and easily produces cracks. When ammonia gas and hydrogen gas corrode the carbon substrate through cracks, the life of the carbon material becomes short.

Thus, an attempt has been made to reduce the crystallinity of tantalum carbide of the coating film obtained by the CVD method, thereby affording a near amorphous state of the coating film to suppress occurrence of cracks and delamination (JP-A-2004-84057). The resulting coating film made of tantalum carbide is superior in density and flexibility.

DISCLOSURE OF THE INVENTION

According to the testing by the present inventors, however, a material having a coating film described in JP-A-2004-84057 was found to have a problem of cracks and delamination as before. To be specific, when this material was used several times in a mixed gas atmosphere of hydrogen and ammonia at a temperature of 1500° C., the crystal structure and crystallinity of tantalum carbide changed to cause cracks and delamination. When such cracks occur, gases such as $N_2$, $O_2$, $CO_2$ and the like remaining in the carbon material are released and incorporated into crystals for semiconductor devices, and defective doping easily occurs in the device. At high temperatures, carbon is very weak for hydrogen and ammonia, and tantalum is embrittled by hydrogen absorption. FIG. 21 and FIG. 22 show microscopically observed images of the coating film obtained by the method of JP-A-2004-84057. FIG. 21 shows the surface and FIG. 22 shows the section. The use for several times at 1500° C. resulted in the corrosion of non-crystallized carbon and tantalum by hydrogen and ammonia, forming pinholes in the coating film, and changes in the crystal structure and crystallinity caused cracks in the coating film, which in turn resulted in a markedly decreased bulk density of the coating film of tantalum carbide. As described in JP-A-2004-84057, the present inventors have first found that a carbon material generally having low crystallinity, which is coated with amorphous-like tantalum carbide, shows deterioration of the coating film during use.

In view of the above situation, the present invention aims at providing a tantalum carbide-coated carbon material having superior resistance to thermal shock and corrosion resistance to a reducing gas (particularly, ammonia, hydrogen, hydrocarbon gas and the like) at a high temperature, and a production method thereof.

The characteristics of the present invention are as follows.
(1) A tantalum carbide-coated carbon material comprising a carbon substrate and a coating film formed on the aforementioned carbon substrate, which film is made of tantalum carbide crystals specifically developed in the (220) plane of tantalum carbide as compared to other Miller planes, wherein the diffraction line of the (220) plane of tantalum carbide shows the maximum diffraction intensity in an X-ray diffraction pattern of the coating film.
(2) The carbon material of (1), wherein, in the X-ray diffraction pattern of the coating film, the half value width of the diffraction line of the (220) plane of tantalum carbide is not more than 0.2°.
(3) The carbon material of (1) or (2), wherein, in the X-ray diffraction pattern of the coating film, the diffraction line of the (220) plane of tantalum carbide shows not less than 4 times the intensity of a diffraction line showing the second highest diffraction intensity.
(4) The carbon material of any of (1)-(3), wherein the coating film shows a nitrogen gas permeability of not more than $10^{-6}$ cm$^2$/sec.
(5) The carbon material of any of (1)-(4), wherein the coating film has a thickness of 10-100 μm.
(6) A method of producing a tantalum carbide-coated carbon material, which comprises subjecting a carbon substrate and a coating film formed on the aforementioned carbon substrate, which film is made of tantalum carbide crystals, wherein, in an X-ray diffraction pattern of the film, the diffraction line of the (220) plane of tantalum carbide shows the maximum diffraction intensity, to a heat treatment at 1600-2400° C. to increase the crystallinity of tantalum carbide of the coating film.
(7) A tantalum carbide-coated carbon material comprising a carbon substrate, an intermediate layer formed on the carbon substrate, which layer is made of a composition comprising carbon and tantalum, and a coating film formed on the intermediate layer, which film is made of a composition comprising tantalum carbide.
(8) The carbon material of (7), wherein the intermediate layer has a more non-uniform chemical composition distribution than the coating film.
(9) The carbon material of (7) or (8), wherein the intermediate layer is more porous than the coating film.
(10) The tantalum carbide-coated carbon material of (9), wherein the intermediate layer is a porous layer obtained by converting the surface of the carbon substrate to tantalum carbide.
(11) The carbon material of (8), wherein the intermediate layer is obtained by embedding tantalum carbide in the pores on the surface of the carbon substrate.
(12) The carbon material of any of (7)-(11), wherein the intermediate layer is a gradient material layer having a concentration gradient, and the carbon/tantalum atomic ratio becomes continuously or stepwisely lower from the carbon substrate side to the coating film side.
(13) The carbon material of (12), wherein the maximum value of the carbon/tantalum atomic ratio of the gradient material layer is not less than 10 and the minimum value thereof is 0.8-1.2.
(14) The carbon material of any of (7)-(13), wherein the intermediate layer has a thickness of not less than 1 μm.
(15) The carbon material of any of (7)-(14), wherein the coating film is a tantalum carbide film produced by chemical vapor deposition.
(16) The carbon material of any of (7)-(15), wherein the carbon/tantalum atomic ratio of the coating film is 0.8-1.2.
(17) The carbon material of any of (7)-(16), wherein, in the X-ray diffraction pattern of the coating film, the diffraction line of the (220) plane of tantalum carbide shows the maximum diffraction intensity.
(18) The carbon material of (17), wherein, in the X-ray diffraction pattern of the coating film, the diffraction line of the (220) plane of tantalum carbide shows not less than 4 times the intensity of a diffraction line showing the second highest diffraction intensity.
(19) The carbon material of (17) or (18), wherein, in the X-ray diffraction pattern of the coating film, the half value width of the diffraction line of the (220) plane of tantalum carbide is not more than 0.2°.
(20) The carbon material of any of (17)-(19), wherein the coating film is obtained by subjecting a tantalum carbide film produced by chemical vapor deposition to a heat treatment at 1600-2000° C.
(21) The carbon material of any of (17)-(20), wherein the thermal expansion coefficient of the coating film as measured by heating from 20° C. to 1000° C. is $6.9 \times 10^{-6}$-$7.8 \times 10^{-6}$/K.

According to one embodiment of the present invention, by orienting tantalum carbide of the coating film to substantially one crystal face, the physical property values of the coating film, such as thermal expansion coefficient, thermal conduction coefficient and Young's modulus, are leveled and the internal stress due to distortion and thermal stress does not occur easily. As a result, cracks and delamination do not occur easily in the coating film even at the time of rapid temperature rise and rapid cooling. According to the new finding of the present inventors, by substantial orientation of tantalum carbide to the (220) plane, or by specifically growing the (220) plane of tantalum carbide as compared to other Miller planes, the above-mentioned effects can be expressed remarkably and a coating film superior in corrosion resistance and resistance to thermal shock can be obtained. FIG. 3 and FIG. 4 show microscopically observed images of the coating film obtained in the present invention.

According to a preferable embodiment, by markedly improving the crystallinity of tantalum carbide of the coating film, corrosion of carbon substrate and pinholes in the coating film can be reduced. According to a preferable embodiment, moreover, by setting the thickness and nitrogen gas permeability of the coating film to particular ranges, corrosion of carbon substrates and gas release from carbon substrates can be suppressed more effectively. According to a preferable production method of the present invention, tantalum carbide can be obtained from tantalum and carbon remaining in the coating film and a coating film further improved in the crystallinity can be formed. As a result, for example, a long-life furnace material can be provided and, using the furnace material, a semiconductor device and the like can be produced in a high yield under stable production conditions.

In a different embodiment of the present invention, an intermediate layer having a particular structure is present via a carbon substrate and a coating film. Hence, the internal stress between the carbon substrate and the coating film of tantalum carbide, which occurs during rapid temperature rise and rapid temperature decrease, can be reduced. The internal stress is caused by the different levels of expansion and shrinkage due to heat, between the carbon substrate and the coating film. According to the present invention, cracks and delamination of the coating film can be reduced because the aforementioned internal stress decreases. According to a preferable embodiment of the present invention, the crystal of tantalum carbide of the coating film substantially orients to the (220) plane, and an intermediate layer is present between the carbon substrate and the coating film. Due to such structure, a particularly strong tantalum carbide-coated carbon material can be provided. Consequently, according to the present invention, for example, a tantalum carbide-coated carbon material that can be used in a high temperature range of not less than 1400° C. for a long time can be provided and, as a result, for example, a long-life furnace material can be provided, using which a semiconductor device and the like can be produced in a high yield under stable production conditions.

The reference symbols used in the Figures mean the following: 1 a carbon substrate, 2, 21 and 22 intermediate layers, 24 an intermediate layer in the form of a gradient material layer, 3 a coating film, 4 a pore, 100 a tantalum carbide-coated carbon material.

BEST MODE FOR EMBODYING THE INVENTION

Figure 1:
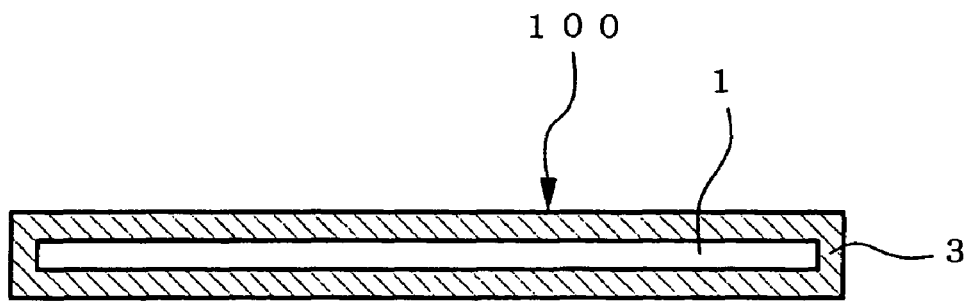
FIG. 1 and FIG. 2 are schematic diagrams of each embodiment of the tantalum carbide-coated carbon materials of the present invention.
Figure 2:
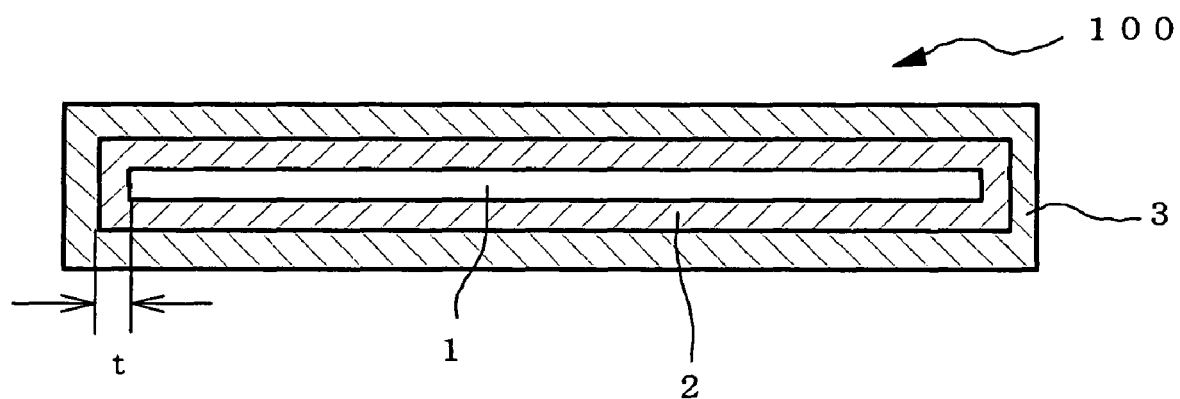
Figure 3:
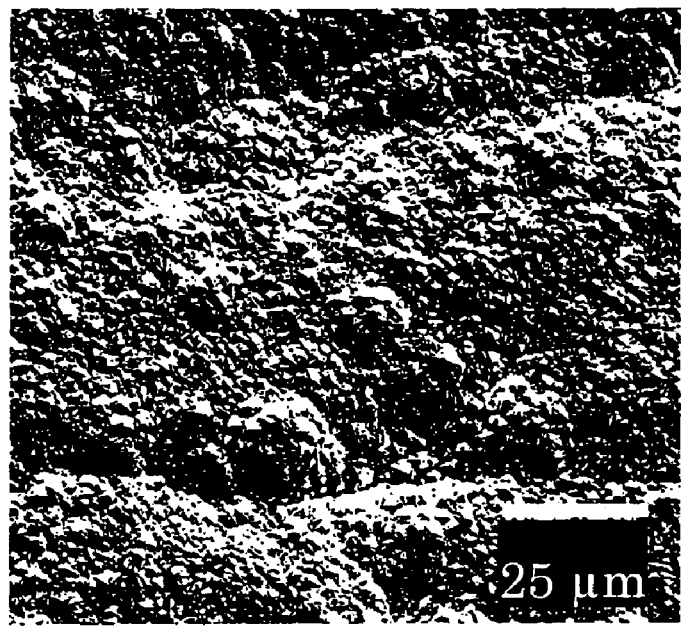
FIG. 3 and FIG. 4 show microscopically observed images of the coating films of the present invention.
Figure 4:
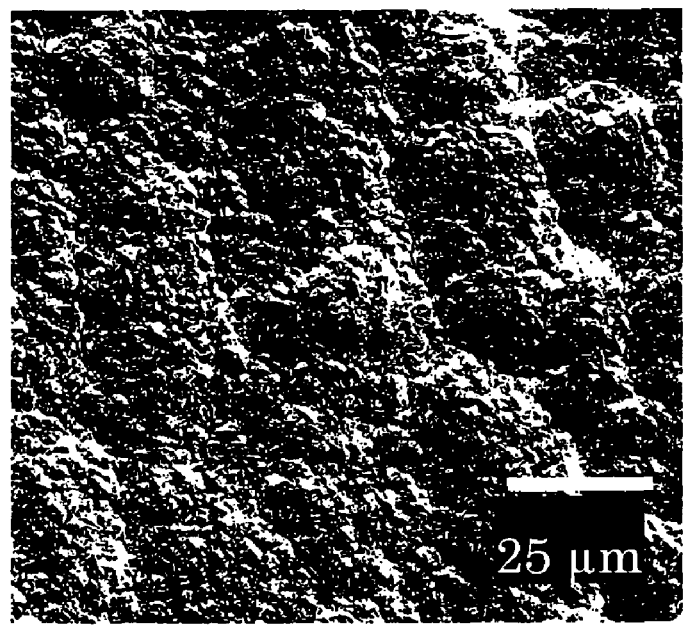

FIG. 1 and FIG. 2 schematically show the tantalum carbide-coated carbon materials of the present invention. The tantalum carbide-coated carbon material 100 of the present invention has a carbon substrate 1 and a coating film 3. As shown in FIG. 1, the coating film 3 may be directly formed on a carbon substrate 1 or, as shown in FIG. 2, the coating film 3 may be formed on a carbon substrate 1 via an intermediate layer 2.

The coating film 3 is made of a composition comprising tantalum carbide and, preferably, the coating film 3 is formed of a dense collection of tantalum carbide crystals wherein the (220) plane is specifically grown as compared to other Miller planes.

According to the present invention, tantalum carbide-coated carbon material 100 has a carbon substrate 1 and a coating film 3 formed on a carbon substrate 1. The tantalum carbide-coated carbon material 100 is simply indicated as "the carbon material of the present invention", or more simply, also indicated as a "carbon material". The carbon material 100 may have an intermediate layer 2 between the carbon substrate 1 and the coating film 3. The carbon substrate 1 is a substrate mainly consisting of carbon, and does not include a coating film and an intermediate layer. The coating film 3 is made of a composition comprising tantalum carbide and is mainly formed of densely collected large number of crystals of tantalum carbide. The intermediate layer 2 is present between the carbon substrate 1 and the coating film 3, and has a chemical composition clearly different from that of the carbon substrate 1 and the coating film 3. Preferably embodiments of these substrate and layers are described in detail in the following.

<Carbon Substrate>

In the present invention, the carbon substrate 1 is not particularly limited as long as it is substrate mainly made of carbon. The form of carbon is not particularly limited, and general graphite, isotropic graphite, carbon fiber reinforced carbon composite material, glassy carbon and the like can be mentioned.

In consideration of the use of the carbon material 100 of the present invention as a member of the inside of a furnace of semiconductor production apparatuses and the like, the carbon substrate 1 preferably does not contain impurity as far as possible. Specifically, the gas release pressure of the carbon substrate 1 relative to the 1000° C. standard is as small as possible and preferably not more than $10^{-4}$ Pa/g. The gas release pressure relative to the 1000° C. standard is the level of dissociation at 1000° C. of gas molecules adsorbed to the surface and fine pores of the carbon substrate 1, which is expressed in the unit pressure. Specifically, it can be measured by the thermal desorption spectrum (TDS) disclosed in JP-B-2684106 and the like.

The thermal expansion coefficient of the carbon substrate 1 is preferably $6.5 \times 10^{-6}$-$9.0 \times 10^{-6}$/K, more preferably $7.0 \times 10^{-6}$-$8.8 \times 10^{-6}$/K. This range is set to be close to the thermal expansion coefficient ($6.9 \times 10^{-6}$-$7.8 \times 10^{-6}$/K) of tantalum carbide. When the thermal expansion coefficient of the carbon substrate 1 is too high or too low, the difference from the thermal expansion coefficient of tantalum carbide becomes greater. As a result, when a coating film 3 is formed optionally via an intermediate layer 2 on the carbon substrate 1 at a high temperature and thereafter the temperature is decreased, a high tensile stress or compression stress occurs in the coating film 3. As a result, cracks may occur in the coating film 3 or the coating film 3 may be delaminated from the carbon substrate 1. The thermal expansion coefficient of the carbon substrate 1 can be measured with a commercially available apparatus. As one embodiment of the apparatus, a thermal analysis apparatus, ThermoPlus 2 TMA8310, manufactured by Rigaku Corporation can be mentioned. The thermal expansion coefficient of the carbon substrate 1 can be measured using $SiO_2$ as a reference in an $N_2$ atmosphere in a temperature range of 293-1273K.

The bulk specific gravity of the carbon substrate 1 is not particularly limited. In consideration of the improvement of the mechanical strength of the carbon substrate 1 itself and difficult delamination of the intermediate layer 2, if any, and the coating film 3 from the carbon substrate 1, the bulk specific gravity of the carbon substrate 1 is preferably 1.65-1.90 g/cm$^3$, more preferably about 1.73-1.83 g/cm$^3$.

The carbon substrate 1 is preferably porous, and the average pore radius of the carbon substrate 1 is preferably 0.01-5 μm, more preferably 1-2 μm. As used herein, the "average pore radius" can be determined by mercury porosimetry (porosimeter2000, manufactured by FISONS). Specifically, the average pore radius is defined as the radius of a sphere of a ½ volume of the cumulative pore volume, when half the maximum pressure is 98 MPa, contact angle between the sample and mercury is 141.3° and pressure is 72 MPa. When the average pore radius is not less than 0.01 μm, what is called an anchor effect is sufficiently provided and the coating film 3 is not delaminated easily. When the average pore radius is not more than 5 μm, the amount of gas released from the carbon substrate 1 at a high temperature becomes small.

The total fine pore volume of the carbon substrate 1 is preferably 5-35 cm$^3$/g, more preferably 10-20 cm$^3$/g. As used herein, the total fine pore volume means a total of the volume of all open pores, which can be simultaneously determined by the aforementioned mercury porosimetry. When the total fine pore volume is not less than 5 cm$^3$/g, the carbon substrate 1 can be impregnated with tantalum carbide to the pores at a sufficient depth, and therefore, the coating film 3 and the carbon substrate 1 are more firmly adhered via the intermediate layer 2. When the total fine pore volume is not more than 35 cm$^3$/g, the mechanical strength of the carbon substrate 1 itself is sufficient, and an inconvenient increase in the amount of gas released from the carbon substrate 1 at a high temperature is obliterated.

A smaller amount of impurity present in the carbon substrate 1 is more preferable, the amount of each element contained as impurity is preferably not more than 0.3 ppm for Al, not more than 1.0 ppm for Fe, not more than 0.1 ppm for Mg, and not more than 0.1 ppm for Si, and the total ash content of the carbon substrate 1 (also to be simply referred to as ash content in this specification) is preferably not more than 10 ppm, more preferably not more than 2 ppm. Within the aforementioned range, the amount of the impurity to be chemically reacted with tantalum carbide at a high temperature is small, and the coating film 3 is preferably not easily delaminated from the carbon substrate 1 via the intermediate layer 2. The ash content can be measured according to the ash content analysis method defined in JIS-R-7223.

As one nonlimiting embodiment of the means for obtaining carbon substrate 1 having a low impurity concentration as mentioned above, a treatment in a halogen gas atmosphere, atmospheric pressure at 1800-2200° C. for 5-30 hr can be mentioned (JP-A-9-100162). As used herein, the halogen gas means a gas of halogen or a compound thereof and, for example, chlorine, chlorine compound, fluorine, fluorine compound, a compound containing chlorine and fluorine in a single molecule (monochlorotrifluoromethane, trichloromonofluoromethane, dichlorofluoroethane, trichloromonofluoroethane etc.) and the like can be mentioned. Halide is produced by the reaction of halogen gas with impurity contained in a carbon substrate, such as metal impurity and the like, and the halide is removed from the carbon substrate 1 by evaporation or volatilization. Subsequently, a halogen gas is flown in the same treatment furnace for a given time, hydrogen gas is supplied to the reaction container, and impurities such as a sulfur component and the like are precipitated as a hydride, whereby the impurities are removed from the carbon substrate 1. As a result, the impurity in the carbon substrate 1 becomes extremely small to fall within the aforementioned range.

Preferably, before formation of the intermediate layer 2 and the coating film 3 of tantalum carbide, the surface of the carbon substrate 1 is washed to remove the attached redundant particles and the like. For washing, scrub washing and a method including use of an organic solvent, acid or alkali solution in an ultrasonication washer can be mentioned. As the organic solvent, acetone, trichloroethylene, methanol, isopropyl alcohol and the like can be mentioned, and as the acid and alkali, hydrochloric acid, nitric acid, hydrofluoric acid, KOH and the like can be mentioned. After washing, solvent and solution are washed away with pure water and the substrate is preferably dried, for example, in a vacuum dryer at 140° C. for 24 hr.

<Coating Film>

The carbon material 100 of the present invention has a coating film 3 on the surface of a carbon substrate 1 optionally via an intermediate layer 2. The coating film 3 is made of a composition comprising tantalum carbide. In the composition, not less than 99.99 wt % is preferably tantalum carbide and, more preferably, all except unavoidable impurity consists of tantalum carbide. Tantalum carbide in the present invention is a compound represented by the chemical formula: $Ta_xC$ wherein x is preferably 0.8-1.2. The thermal expansion coefficient of the coating film 3 is preferably $6.9 \times 10^{-6} - 7.8 \times 10^{-6}$/K. The thermal expansion coefficient of the coating film 3 can be measured using $SiO_2$ as a reference in an $N_2$ atmosphere with heating from 293K to 1273K in the same manner as for the aforementioned carbon substrate 1 and using a thermal analysis apparatus ThermoPlus 2 TMA8310, manufactured by Rigaku Corporation.

Preferably, the coating film 3 substantially consists of tantalum carbide crystals wherein the (220) plane is specifically grown as compared to other Miller planes. As described in JP-A-2004-84057, there was conventionally an inclination to use a coating film made of tantalum carbide oriented in a number of crystal faces or tantalum carbide with lowered crystallinity. In a preferable embodiment of the present invention, completely different from the prior art, tantalum carbide is oriented in a particular crystal face, i.e., (220) plane. As a result, a carbon material 100 superior in corrosion resistance and resistance to thermal shock can be obtained. In this embodiment, the coating film 3 is formed at least on a part of the carbon substrate 1, preferably to cover the entire surface of the carbon substrate 1. The coating film 3 may be directly formed on the carbon substrate 1, or formed via the below-mentioned intermediate layer.

In this embodiment, the coating film 3 of tantalum carbide is formed by specifically growing the (220) plane of tantalum carbide as compared to other Miller planes, and the coating film 3 may contain tantalum carbide oriented in other crystal face, as long as the action and effect of the present invention is not inhibited. The level of orientation of tantalum carbide constituting the coating film 3 can be quantitated by X-ray diffraction.

Preferably, in the X-ray diffraction pattern of the coating film 3, the diffraction line of the (220) plane of tantalum carbide shows the maximum diffraction intensity. Preferably, moreover, in the X-ray diffraction pattern of the coating film 3, the diffraction line of the (220) plane of tantalum carbide shows not less than 4 times, more preferably not less than 8 times, the intensity of the second highest diffraction intensity of the diffraction line. In the X-ray diffraction pattern of the coating film 3, the half value width of the diffraction line of the (220) plane of tantalum carbide is preferably not more than 0.2°, more preferably 0.10°-0.16°. The X-ray diffraction pattern of the coating film 3 is a curve obtained by measuring the intensity of the diffraction line upon irradiation of X-ray on the coating film 3, and plotting the diffraction angle (2θ) on the axis of abscissas and the diffraction intensity on the vertical axis. The diffraction line of the (220) plane of tantalum carbide appears in the diffraction angle at about 58° in the above-mentioned X-ray diffraction pattern. The height of the diffraction intensity means the maximum height of the peak. The half value width of the diffraction line means the peak width at the intensity at ½ of the maximum height, and is an index of the crystallinity of the crystal face derived from the peak.

The X-ray diffraction pattern of the coating film 3 can be determined by a known method. To be specific, X-ray is irradiated from a Cu tube on the surface of the coating film 3 of tantalum carbide (measurement object) formed on the carbon substrate 1. As the X-ray analysis apparatus, an X-ray Diffractometer RINT2000 manufactured by Rigaku Corporation can be mentioned. The crystal profile of the coating film 3 is measured, and a treatment for appropriate amendment due to the apparatus, crystal structure and the like is conducted to give an X-ray diffraction pattern, based on which the diffraction line and the half value width are determined.

The nitrogen gas permeability of the coating film 3 is preferably not more than $10^{-6}$ cm$^2$/sec, more preferably $10^{-8}$-$10^{-11}$ cm$^2$/sec. A smaller nitrogen gas permeability is preferable because the coating film 3 is dense and strong. In general, the nitrogen gas permeability of graphite as substrate 1 is $10^{-2}$-$10^{-3}$ cm$^2$/sec. A nitrogen gas permeability of the coating film 3 of not more than $10^{-6}$ cm$^2$/sec means not more than 1/1000 of the nitrogen gas permeability of the graphite. Therefore, as long as it is within the above-mentioned range, the coating film 3 can be said to be sufficiently dense.

Figure 5:
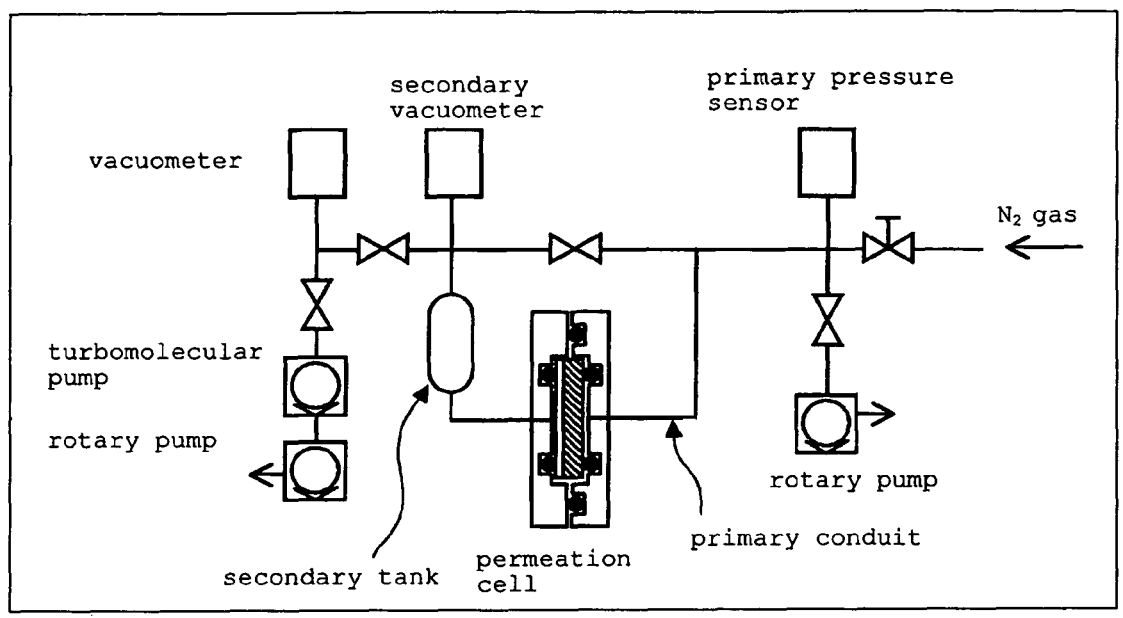
FIG. 5 shows the outline of the nitrogen gas permeability measurement.

The measurement method of the nitrogen gas permeability of the coating film is generally explained by reference to FIG. 5. The measurement sample is a disc having a diameter of not less than 30 mm and is sufficiently dried before measurement. The measurement sample is set in a cell, cell primary and secondary tanks are depressurized to a given vacuum value with a rotary vacuum pump and a turbomolecular pump. Then, the vacuum pump is stopped and the valve is closed. $N_2$ gas is added to the primary tank at a given test pressure. The $N_2$ gas moves from the primary tank through the measurement sample to the secondary tank. As a result, the pressure of the secondary tank starts to increase. The pressure increase rate is measured. The gas permeability (K) is calculated according to the following formulas (1), (2).

$$K=(QL)/(\Delta PA) \quad (1)$$

$$Q=\{(p_2-p_1)V_0\}/t \quad (2)$$

wherein K is a nitrogen gas permeability, Q is a quantity of airflow, ΔP is a pressure difference between the primary tank and the secondary tank, A is a permeation area, L is a thickness of the measurement sample, $p_1$ is the initial pressure of the secondary tank, $p_2$ is the final pressure of the secondary tank, $V_0$ is a volume of the secondary tank, and t is a measurement time.

For determination of the nitrogen gas permeability ($K_2$) of the coating film 3, nitrogen gas permeability ($K_0$) of the carbon material 100 comprising the carbon substrate 1 and the coating film 3 formed thereon is measured, then the coating film 3 is removed by grinding, and the nitrogen gas permeability ($K_1$) of the carbon substrate 1 alone is measured. Then $K_2$ is calculated from the following formula (3).

$$(L_1+L_2)/K_0=L_1/K_1+L_2/K_2 \quad (3)$$

wherein $L_1$ is a thickness of the carbon substrate and $L_2$ is a thickness of the coating film of tantalum carbide.

Figure 6:
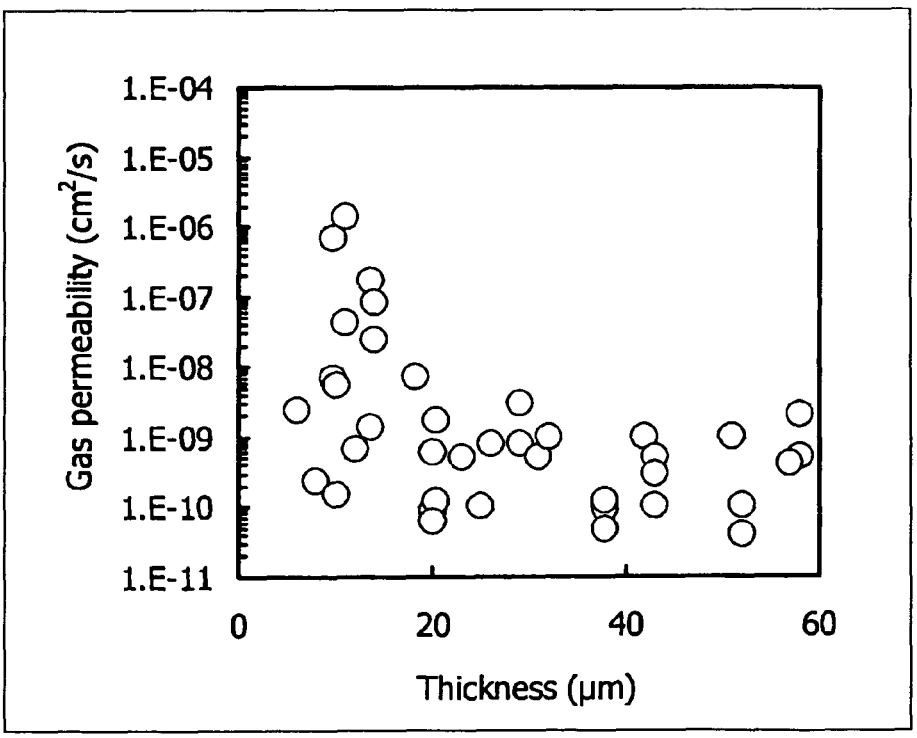
FIG. 6 shows one example of the relationship between the thickness of the coating film and nitrogen gas permeability.

In the present invention, the thickness of the coating film 3 is preferably 10-100 μm, more preferably 30-80 μm. As shown in FIG. 6, when the thickness of the coating film 3 is not less than 10 μm, the nitrogen gas permeability of the coating film becomes markedly small. In addition, when the thickness of the coating film 3 is not less than 10 μm crystallinity of the tantalum carbide of the coating film 3 is markedly improved and the corrosion resistance and resistance to thermal shock of the coating film 3 are improved. On the other hand, when the thickness of the coating film 3 increases, the internal stress of the coating film 3 increases. Thus, easy delamination of the coating film 3 and decreased resistance to thermal shock are feared. Therefore, the film thickness is preferably not more than 100 μm.

The tantalum source of the tantalum carbide of the coating film 3 is not limited as long as it contains tantalum. Preferably, though without limitation, the coating film 3 is formed by chemical vapor deposition (CVD). When performing CVD, a mixed gas of a starting material gas such as a halogen compound of tantalum such as $TaCl_5$, $TaF_5$ and the like, and hydrocarbon, preferably alkane having 1 to 4 carbon atoms, more preferably $CH_4$, $C_3H_8$ and the like, and hydrogen gas or argon gas is obtained, the obtained mixed gas is subjected to a thermal decomposition reaction, and the tantalum carbide obtained by the reaction is deposited on the carbon substrate 1 to give a coating film 3.

Figure 7:
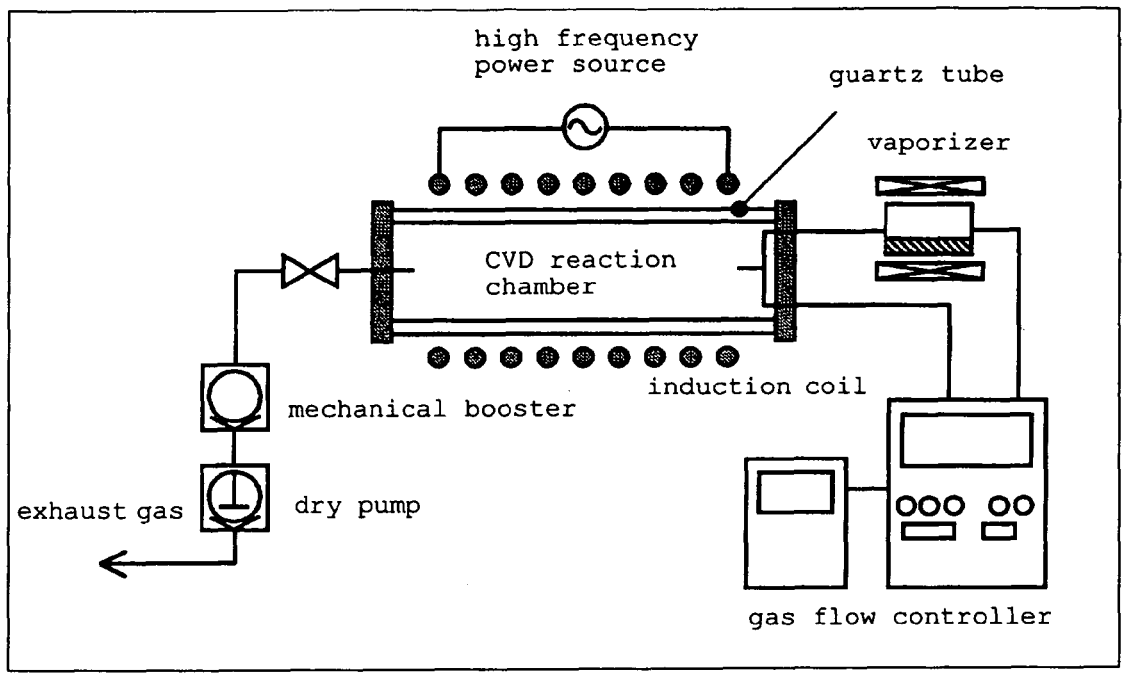
FIG. 7 shows an overview of a high-frequency induction heating type vacuum furnace.

FIG. 7 is a schematic diagram of a high-frequency induction heating type vacuum furnace. The vacuum furnace can be used as a CVD apparatus for the above-mentioned production method. The reaction chamber includes a double quartz tube, and a heat insulator, graphite furnace wall to be a induction load inside the tube, and a heating apparatus comprising a high frequency coil and the like for heating the reaction chamber. A gas introducing tube for introducing the starting material gas is installed in the reaction chamber, an exhaust outlet for exhausting the reaction chamber is set. A variable valve is set on the exhaust outlet, and the pressure in the reaction chamber can be adjusted by the operation of the valve.

When the coating film 3 is produced by CVD, a mixed gas of Ta starting material gas, hydrocarbon gas, hydrogen gas and argon gas is supplied from the gas introducing tube in the upstream of the reaction tube. The Ta starting material gas is supplied by heating and vaporizing the aforementioned tantalum halide and the like in a starting material tank. As the hydrogen gas and argon gas, those having a high purity of not less than 99.99% and an oxygen content of not more than 5 ppm are preferable. Generally, the production is performed in the order of vacuuming, heating, CVD treatment, heat treatment and cooling. One or plural carbon substrates 1 are placed in a reaction chamber, the pressure in the reaction chamber is lowered to about 1.33 Pa-13.3 Pa. Then $H_2$ gas is introduced into the reaction chamber at 7000 cc/min, heated to about 1100° C. and the inside of the reaction chamber is degassed. Thereafter, the inside of the reaction chamber is cooled to about 750-950° C., preferably about 800-950° C., and the carbon substrate 1 is subjected to a CVD treatment at this temperature to coat the substrate with tantalum carbide. During the CVD treatment, the temperature of the carbon substrate 1 in the reaction chamber is set to 750-950° C., preferably 800-950° C., more preferably 800-900° C., and the pressure in the reaction chamber is set to 133 Pa-53.3 kPa. When the CVD treatment is applied at not less than 750° C., a coating film 3 having an atomic ratio of Ta atom to C atom of 1.5 tends to be formed, and a desired the coating film 3 of tantalum carbide is easily obtained. In addition, when the CVD treatment is applied at not more than 950° C. and not more than 53.3 kPa, tantalum carbide is preferably obtained easily in the form of a film rather than a finely divided powder.

It is also possible to introduce the starting material gas into the reaction chamber after the carbon substrate 1 in the reaction chamber reaches the given temperature and pressure. The gas flow at this time is, for example, 2-200 cc/min, preferably 5-30 cc/min, for $TaCl_5$ gas, 25-2500 cc/min, preferably 60-450 cc/min, for $C_3H_8$ gas, 100-10000 cc/min, preferably 250-1300 cc/min, for hydrogen gas, and 400-40000 cc/min, preferably 1000-6000 cc/min, for argon gas. By appropriately combining the CVD conditions such as temperature, pressure, each gas flow, treatment time and the like, the growth rate can be controlled to 1-50 μm/hr and a coating film 3 of tantalum carbide having a desired thickness can be formed on the carbon substrate 1.

Preferably, the heat treatment is conducted after formation of the coating film 3 of tantalum carbide. Due to the heat treatment, redundant tantalum and carbon remaining in the coating film 3 are activated and converted to tantalum carbide, thus improving the crystallinity. To be specific, after the CVD treatment, the pressure in the reaction chamber is lowered to about 1.33 Pa-13.3 Pa while keeping the carbon material 100 in the reaction chamber. Then, $H_2$ gas, Ar gas, He gas, or a mixed gas containing these gases and a trace amount of hydrocarbon gas is introduced at 100-5000 cc/min, and the inside of the reaction chamber is heated again while adjusting the pressure in the reaction chamber to 12-101 kPa, preferably 53.3 kPa. The heating temperature is 1600-2400° C., preferably 1600-2000° C., and the treatment is conducted at this temperature for 5-10 hr. After completion of the treatment, the inside of the reaction chamber is cooled to a given temperature, and a carbon material 100 as a product is removed from the reaction chamber. It is desirable to set the rate of temperature rise and temperature decrease not more than 50° C./min to reduce the thermal stress developed in the coating film 3.

<Intermediate Layer>

In a preferable embodiment of the present invention, the carbon substrate 1, the intermediate layer 2 and the coating film 3 are laminated in this order.

The intermediate layer 2 is present between the two kinds of heterologous layers of the carbon substrate 1 and the coating film 3 of tantalum carbide, which alleviates difference in the physical properties such as thermal expansion, lattice mismatch and the like, and is preferably made of a composition containing carbon and tantalum. The composition of the intermediate layer 2 may be, for example, a compound containing both a carbon element and a tantalum element (e.g., tantalum carbide having different composition from the coating film 3), or a mixture of a material containing a carbon element and a material containing a tantalum element. A preferable embodiment of the composition constituting the intermediate layer 2 is mentioned below.

According to a preferable embodiment of the present invention, the intermediate layer 2 is more porous than the coating film 3 or shows more non-uniform distribution of chemical composition than does the coating film 3. In consideration of the sufficient adhesion to the carbon substrate 1 and the coating film 3 of tantalum carbide, the intermediate layer 2 preferably has a thickness of not less than 1 μm. Since a more preferable thickness varies depending on the form of the intermediate layer 2, it is described later.

When the intermediate layer 2 is more porous than the coating film 3, it is expected that an anchor effect is afforded between the coating film 3 and the porous intermediate layer 2 to form a strong the coating film 3. As a result, it is expected that voids in the intermediate layer 2 absorb and alleviate the mismatch due to the heat shrink of the carbon substrate 1, which in turn reduces the thermal stress in the coating film 3. Which of the intermediate layer 2 and the coating film 3 of tantalum carbide is more porous can be confirmed by observation with an optical microscope or a scanning electron microscope, the aforementioned mercury porosimetry method and the like. It is clear without the need of measurement that the intermediate layer 2 obtained by converting the surface of a porous carbon substrate 1 to tantalum carbide, to be mentioned below, is more porous than the coating film 3 obtained, for example, by chemical vapor deposition.

Figure 8:
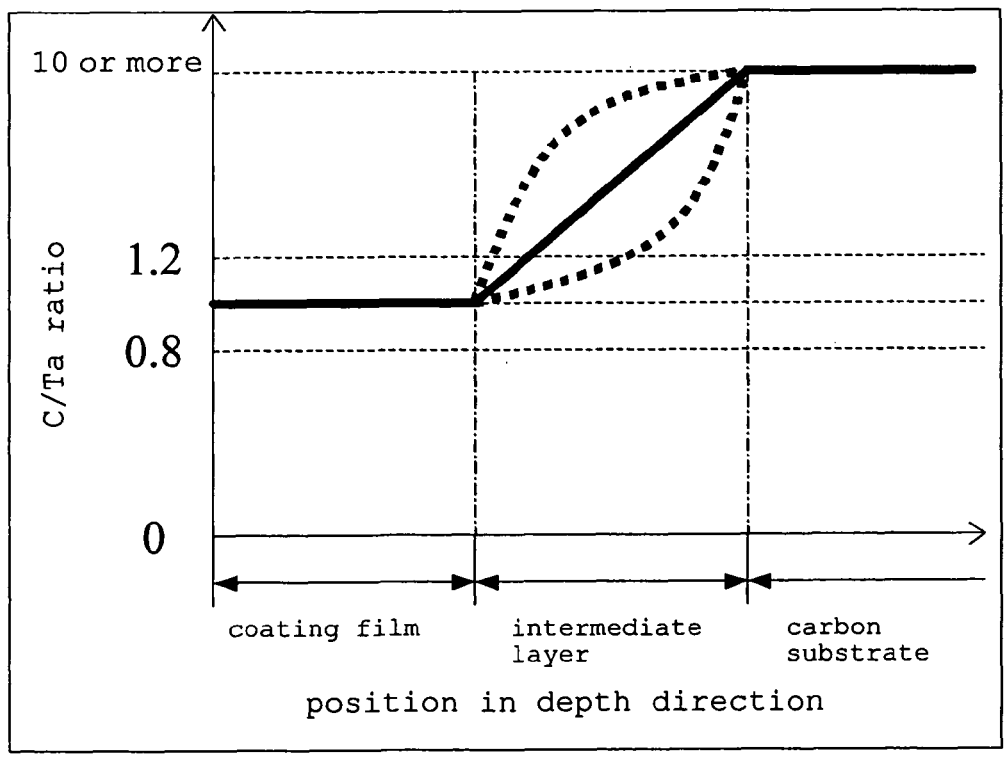
FIG. 8 shows the chemical composition distribution of the tantalum carbide-coated carbon material of one embodiment of the present invention.

On the other hand, when the intermediate layer 2 has a more non-uniform distribution of the chemical composition than the coating film 3, the intermediate layer 2 comes to have a higher binding force with both the coating film 3 and the carbon substrate 1. As a result, it is expected that the coating film 3 and the carbon substrate 1 are firmly bonded via the intermediate layer 2 and cracks and delamination decrease. When the intermediate layer 2 shows a distribution of chemical composition, that continuously or stepwise changes from the carbon substrate 1 side to the coating film 3 side, the properties of the intermediate layer 2, such as thermal expansion coefficient, thermal conduction coefficient and the like, also change stepwise rather than precipitously from the carbon substrate 1 side to the coating film 3 side. Therefore, the thermal stress of the coating film 3 is expected to be reduced. The non-uniformity of the distribution of the chemical composition of the intermediate layer 2 can be evaluated based on the level of dispersion in the chemical composition when a number of regions sufficiently smaller in size than the intermediate layer 2 and the coating film 3 are measured, and can be evaluated and confirmed by a known means such as chemical composition analysis utilizing the backscattered electron images of an electron microscope, chemical composition analysis utilizing the Auger electron spectroscopy and the like. Specific examples thereof include an embodiment realizing a non-uniform distribution of chemical composition by embedding tantalum carbide in the surface pores of the carbon substrate 1, or by imparting, to the intermediate layer 2, a concentration gradient of the carbon/tantalum atomic ratio that decreases from the carbon substrate 1 side to the coating film 3 side, which is mentioned below. FIG. 8 schematically shows the distribution of chemical composition of the carbon material 100 according to such embodiment, wherein the chemical composition distribution changes continuously from the carbon substrate 1 to the coating film 3 via the intermediate layer 2.

While three preferable embodiments of the intermediate layer are explained in more detail in the following, the intermediate layer of the carbon material 100 of the present invention is not limited to the embodiments.

Intermediate Layer

Preferable Embodiment 1

Figure 9:
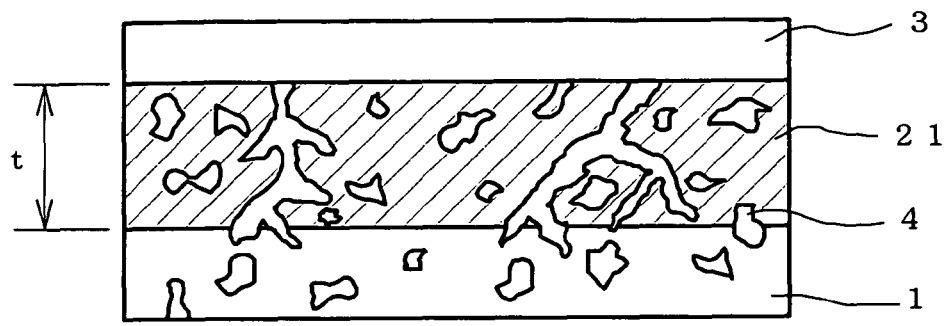
FIG. 9-FIG. 11 schematically show each embodiment of the tantalum carbide-coated carbon materials of the present invention.

FIG. 9 schematically shows the carbon material of this preferable embodiment (hereinafter to be also referred to as the first embodiment), wherein the first preferable intermediate layer 21 is depicted with an emphasis. In the first embodiment, a layer 21 obtained by converting the surface of the carbon substrate 1 to tantalum carbide is an intermediate layer. In general, since the carbon substrate 1 is porous, the intermediate layer 21 in this embodiment is also porous. In this embodiment, therefore, the average pore radius of the intermediate layer 21 is preferably 0.01-5 μm, more preferably 1-2 μm, and the total fine pore volume is preferably 5-35 $cm^3/g$, more preferably 10-20 $cm^3/g$. In FIG. 9, pore 4 is emphatically depicted to express that the carbon substrate 1 and the intermediate layer 21 are porous. A pore 4 may be an open pore penetrating the intermediate layer 21 in the thickness direction, or a closed pore that does not penetrate the intermediate layer 21 in the thickness direction. The intermediate layer 21 may contain both open pores and closed pores. In this embodiment, the thickness t of the intermediate layer 21 is preferably not less than 1 μm, more preferably 30-200 μm. When the thickness t is not less than 1 μm, the intermediate layer 21 sufficiently adheres to the carbon substrate 1 and the coating film 3. While the intermediate layer 21 may be thick, when it exceeds 200 μm, the effect of the invention becomes saturated.

A method for forming the intermediate layer 21 by converting the carbon substrate 1 is exemplarily shown in the following.

The method given here (not shown) includes covering the carbon substrate 1 with tantalum by the CVD method. The method for covering with tantalum is not limited to CVD methods such as thermal CVD, plasma CVD and the like, and PVD methods such as vacuum vapor deposition method, sputtering method, ion plating method and the like may be employed. Other than these vapor deposition methods, the surface of the carbon substrate 1 can also be converted to tantalum carbide by burying the carbon substrate 1 in tantalum oxide finely divided powder and heating it to not less than 1000° C. in an inert atmosphere. However, the CVD method is desirable, since the thickness t of the intermediate layer 21 can be controlled more easily.

The CVD method can be performed using a high-frequency induction heating type vacuum furnace exemplarily shown in FIG. 7, which has been explained for the formation method of the coating film.

A specific example of coating with tantalum is now explained. A mixed gas of Ta starting material gas, hydrogen gas and argon gas is supplied from the gas introducing tube in the upstream of the reaction tube. As the Ta starting material gas, any can be used without limitation as long as it contains tantalum and, for example, halogen compounds such as $TaCl_5$, $TaF_5$ and the like are preferable. The aforementioned tantalum halide and the like are heated and vaporized in a starting material tank. As the hydrogen gas and argon gas, those having a high purity of not less than 99.99% and an oxygen content of not more than 5 ppm is preferably used. Generally, the intermediate layer 21 is obtained by covering with tantalum by vacuuming, heating or CVD, and conversion to tantalum carbide. First, one or more carbon substrates 1 are placed in the reaction chamber, and the pressure in the reaction chamber was lowered to about 1.33 Pa-13.3 Pa. Then, $H_2$ gas is introduced into the reaction chamber at a flow rate of 7000 cc/min and heated to about 1800° C. to perform and a degassing treatment of the reaction chamber.

Thereafter, the inside of the reaction chamber is cooled to about 1200-1600° C., and a CVD treatment is performed at this temperature to cover the carbon substrate 1 with tantalum. The CVD treatment is performed at a temperature of the carbon substrate 1 of 1200-1600° C. in the reaction chamber and a pressure in the reaction chamber of 1.33 kPa-53.3 kPa. When the temperature is not less than 1200° C., halogen compound and the like which are tantalum starting materials are sufficiently decomposed and tantalum can be preferably covered. Since a temperature of not more than 1600° C. and a pressure of not more than 53.3 kPa cause decomposition of the tantalum starting material gas at an appropriate rate and permit easy growth on the surface of the carbon substrate 1, good tantalum covering is consequently achieved. The starting material gas to be supplied into the reaction chamber is introduced into the reaction chamber after the carbon substrate 1 in the reaction chamber has reached given temperature and pressure. Each gas flow rate is, for example, 20 cc/min for $TaCl_5$ gas, 1000 cc/min for hydrogen gas and 4000 cc/min for argon gas. An appropriately combination of CVD conditions such as the temperature, pressure, each gas flow, treatment time and the like enables control of the growth rate to 1-50 μm/hr, and formation tantalum coating with a desired thickness on the carbon substrate 1. For control of the thickness t of the intermediate layer 21 by conversion, the thickness of tantalum coating at this stage only needs to be adjusted, where the tantalum coating only needs to be made thicker by about 0.8-1.2 μm to increase the thickness t of the intermediate layer 21 by 1 μm.

After coating with tantalum, the tantalum starting material gas remaining in the reaction chamber is sufficiently substituted with hydrogen gas and argon gas, and the surface of the carbon substrate 1 is subjected to a reaction to convert the surface to tantalum carbide. The "conversion" means to react carbon in the surface of the carbon substrate 1 with tantalum at a high temperature to obtain tantalum carbide. The gas atmosphere for conversion is preferably a hydrogen gas or argon gas atmosphere, more preferably a mixed gas atmosphere of hydrogen gas and argon gas with hydrocarbon gases of $C_3H_8$, $CH_4$ and the like. The pressure for conversion is preferably not less than 13.3 kPa, more preferably 53.3 kPa-101.3 kPa. The temperature for conversion is preferably not less than 1800° C., more preferably 2200-3000° C. The time necessary for conversion is generally 5-20 hr, preferably 10-20 hr. After completion of the conversion, the temperature in the reaction chamber is decreased to the aforementioned temperature for forming the coating film 3.

Intermediate Layer

Preferable Embodiment 2

Figure 10:
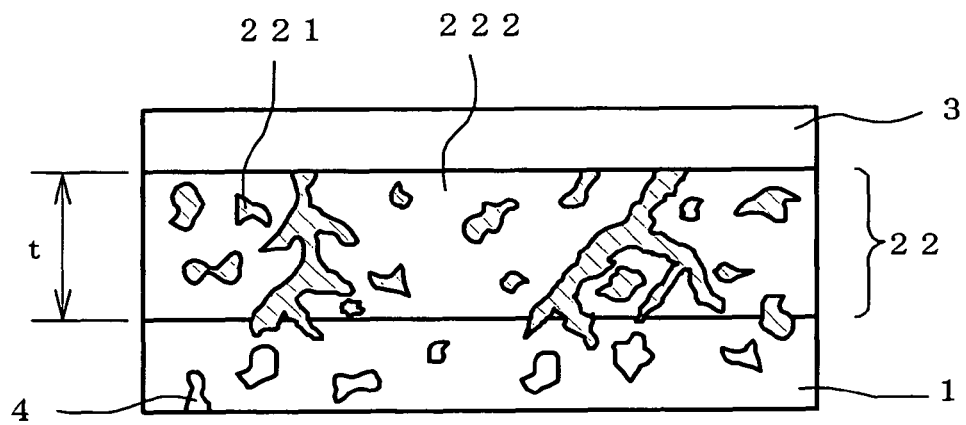

FIG. 10 schematically shows the carbon material of this preferable embodiment (hereinafter to be also referred to as the second embodiment), wherein the second preferable intermediate layer 22 is depicted with an emphasis. In the second embodiment, tantalum carbide is embedded in the pores in the surface of the carbon substrate 1, a layer 22 including the part where tantalum carbide is embedded is recognized as the intermediate layer. In this embodiment, the intermediate layer 22 has a part 222 made of carbon derived from the carbon substrate 1 and a part 221 made of tantalum carbide embedded in the parts that were pores before treatment. As a result, the intermediate layer 22 has a non-uniform distribution of chemical composition. However, it is not necessary to embed tantalum carbide in all the pores present in the intermediate layer 22, and the pores may be partially present as they are. In the second embodiment, the thickness t of the intermediate layer is preferably not less than 1 μm, more preferably 50-300 μm. When the thickness t is not less than 1 μm, the intermediate layer 22 sufficiently adheres to the carbon substrate 1 and the coating film 3. While the intermediate layer 22 may be thick, when it exceeds 300 μm, the effect of the invention becomes saturated.

A method for forming the intermediate layer 22 by embedding tantalum carbide in the pores of the carbon substrate 1 is exemplarily shown in the following.

The method given here (not shown) includes impregnating the carbon substrate 1 with tantalum by the chemical vapor impregnation (CVI) method. It is also possible, without application of the CVI method, to heat, after coating the carbon substrate 1 with tantalum by the CVD method or PVD method as in the aforementioned first embodiment, the substrate to not less than 3000° C. to melt the tantalum for impregnation of the carbon substrate 1 with molten tantalum into the pores. However, the CVI method is desirable, since the thickness t of the intermediate layer 22 can be controlled more easily.

The CVI method can be performed using a high-frequency induction heating type vacuum furnace exemplarily shown in FIG. 7, which has been explained for the first preferable embodiment. For impregnation with tantalum, a mixed gas of a Ta starting material gas, hydrogen gas and argon gas is supplied as in the first embodiment. As the Ta starting material gas, hydrogen gas and argon gas, those similar to the ones used in the first embodiment can be used. The CVI method is preferable, since the gas penetration depth becomes greater when the gas reaction rate is lower. Thus, use of $TaCl_5$ that makes the reaction rate comparatively lower is preferable. Generally, the production affords the intermediate layer 22 by vacuuming, heating, and tantalum impregnation by CVI and conversion to tantalum carbide. The vacuuming and the degassing treatment are preferably performed under the similar conditions as in the first embodiment.

Thereafter, the inside of the reaction chamber is cooled to about 750-1200° C., and a CVI treatment is performed at this temperature to embed tantalum in the carbon substrate 1. The CVI treatment is performed at a temperature of the carbon substrate 1 of 750-1200° C. in the reaction chamber and a pressure in the reaction chamber of 1.33 Pa-1.33 kPa. When the temperature is not less than 750° C., halogen compound and the like which are tantalum starting materials are sufficiently decomposed and tantalum can be preferably impregnated. Since a temperature of not more than 1200° C. and a pressure of not more than 1.33 kPa cause decomposition of the tantalum starting material gas at an appropriate rate and an adequate diffusion distance of tantalum to the carbon substrate 1, impregnation of tantalum to the desired depth can be consequently achieved with ease. The starting material gas to be supplied into the reaction chamber is introduced into the reaction chamber after the carbon substrate 1 in the reaction chamber has reached given temperature and pressure. Each gas flow rate is, for example, 20 cc/min for $TaCl_5$ gas, 1000 cc/min for hydrogen gas and 4000 cc/min for argon gas. An appropriately combination of CVI conditions such as the temperature, pressure, each gas flow amount, treatment time and the like enables control of the tantalum impregnation depth to 1-100 μm/hr. For example, a greater tantalum impregnation depth can be achieved by reducing the temperature in the reaction chamber, reducing the pressure in the reaction chamber and changing the pressure in a pulse-like manner in the reaction chamber.

After impregnation with tantalum, the tantalum starting material gas remaining in the reaction chamber is sufficiently substituted with hydrogen gas and argon gas, and the impregnated tantalum is reacted with the surrounding carbon of the carbon substrate 1 to convert the tantalum to tantalum carbide. The pressure for conversion is preferably not less than 13.3 kPa, more preferably 53.3 kPa-101.3 kPa. The temperature for conversion is preferably not less than 1800° C., more preferably 2200-3000° C. The time necessary for conversion is generally 5-20 hr, preferably 10-20 hr. After completion of the conversion, the temperature in the reaction chamber is decreased to the aforementioned temperature for forming the coating film 3.

Figure 11:
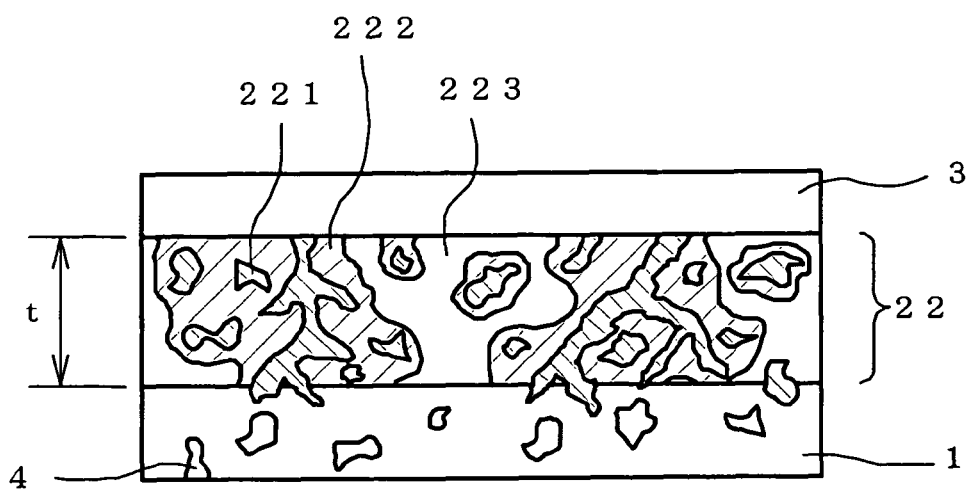
Figure 12:
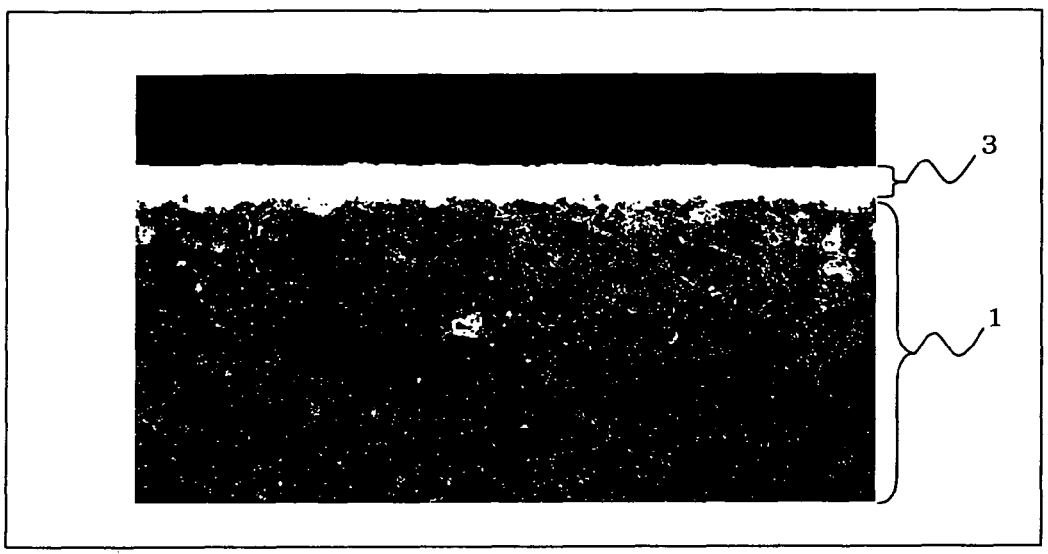
FIG. 12 shows an SEM observation image of the section of a tantalum carbide-coated carbon material free of an intermediate layer.
Figure 13:
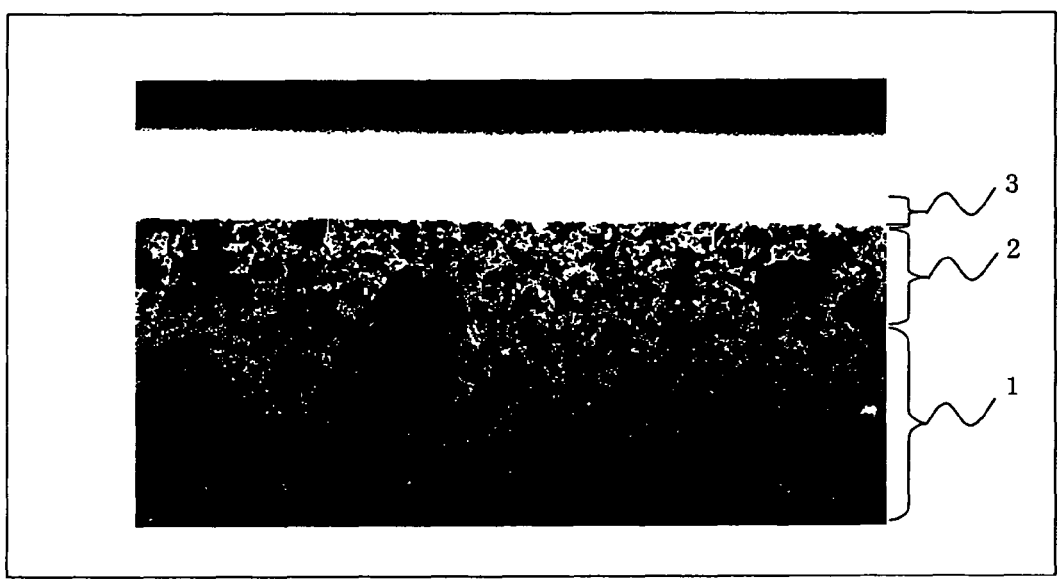
FIG. 13 shows an SEM observation image of the section of a tantalum carbide-coated carbon material having an intermediate layer.

During conversion of tantalum in the pore to tantalum carbide as mentioned above, the carbon material around the pores may be simultaneously converted to tantalum carbide. FIG. 11 shows such embodiment, wherein the intermediate layer 22 may comprise tantalum carbide 221 embedded in the pores of the carbon substrate, an area 222 where the carbon material surrounding the tantalum carbide 221 has been converted to tantalum carbide and an area 223 where the carbon derived from the substrate remains as it is. FIG. 13 shows an SEM observation image of the section of the carbon material of such embodiment. FIG. 12 shows an SEM observation image of the section of the carbon material free of an intermediate layer.

As mentioned above, the CVD method and CVI method relating to the coating/impregnation with tantalum are performed by similar operations, and the CVD method and the CVI method can be basically distinguished based on temperature and pressure. However, depending on the temperature and pressure, both coating and impregnation with tantalum are simultaneously achieved and, consequently, as shown in FIG. 9, a layer (the first preferable intermediate layer 21) where the surface of the carbon substrate has been converted to tantalum carbide and a layer (the second preferable intermediate layer 22) where tantalum carbide is embedded in the pores in the layer 21 may be co-present. Such embodiment is also encompassed in the present invention.

Intermediate Layer

Preferable Embodiment 3

Figure 14:
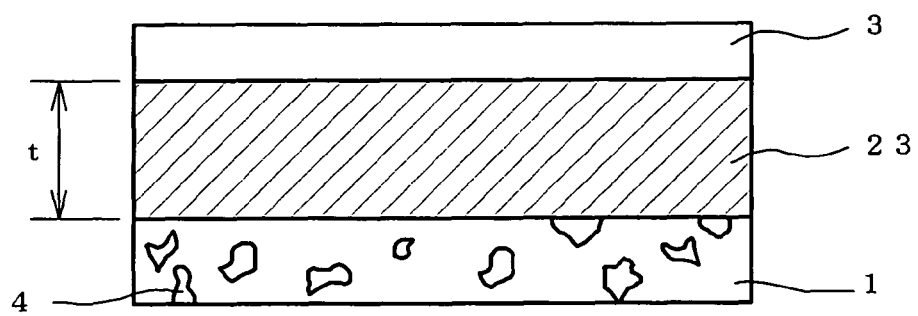
FIG. 14 schematically shows the tantalum carbide-coated carbon material of one embodiment of the present invention.

FIG. 14 schematically shows the carbon material of this preferable embodiment (hereinafter to be also referred to as the third embodiment), wherein the third preferable intermediate layer 23 is depicted with an emphasis. In the third embodiment, a gradient material layer 23 is formed as an intermediate layer on the surface of the carbon substrate 1. The gradient material layer 23 has a concentration gradient where the carbon/tantalum atomic ratio (hereinafter to be also referred to as C/Ta ratio) decreases continuously or stepwisely from the carbon substrate 1 side to the coating film 3 side. In other words, the C/Ta ratio is high in the carbon substrate 1 side and becomes lower toward the coating film 3 side. Since the C/Ta ratio of the intermediate layer 23 changes within the layer in such a manner, the distribution of chemical composition becomes non-uniform. In this embodiment, the thickness t of the intermediate layer 23 is preferably not less than 1 μm, more preferably 1-10 μm, further preferably 3-5 μm. When the thickness t is not less than 1 μm, the intermediate layer 23 sufficiently adheres to the carbon substrate 1 and the coating film 3. In the gradient material layer 23, a composition immediately near the carbon substrate 1 is preferably extremely close to the carbon substrate 1, and a composition immediately near the coating film 3 is preferably extremely close to the coating film 3. To be specific, the maximum C/Ta ratio of the gradient material layer 23 is preferably not less than 10, more preferably not less than 1000, and the minimum value is preferably 0.8-1.2. The gradient material layer 23 preferably comprises a region having a thickness of not less than 1 μm, which is made of a material having a C/Ta ratio of more than 1.2 and less than 10. In this embodiment, the gradient material layer 23 is preferably dense to the same level as the below-mentioned the coating film 3 of tantalum carbide.

An example method for forming the gradient material layer 23 is given in the following.

The method exemplarily given here (not shown) includes coating the carbon substrate 1 with tantalum carbide while controlling the atomic ratio of carbon and tantalum by the CVD method. The CVD method can be performed using a high-frequency induction heating type vacuum furnace exemplarily shown in FIG. 7, which has been explained for the first preferable embodiment. As the Ta starting material gas, hydrogen gas and argon gas, those similar to the ones used in the first embodiment can be used. As the starting material of carbon, hydrocarbon gas is preferably used, alkane gas having 1 to 4 carbon atoms is more preferably used, and $CH_4$, $C_3H_8$ and the like are further preferably used.

In general, the intermediate layer 23, namely, a gradient material layer, is obtained by vacuuming, heating and CVD. The vacuuming and the degassing treatment are preferably performed under the similar conditions as in the first embodiment. Thereafter, the inside of the reaction chamber is cooled to about 750-950° C., and the CVD treatment is started. The CVD treatment is performed at a temperature of the carbon substrate 1 of preferably 750-950° C. in the reaction chamber and a pressure in the reaction chamber of preferably 133 Pa-53.3 kPa. When the temperature is not less than 750° C., the C/Ta ratio can be easily controlled, and when it is not more than 950° C. and the pressure is not more than 53.3 kPa, tantalum carbide does not become a finely divided powder. Thus, a superior gradient material layer 23 can be obtained. To obtain the gradient material layer 23, for example, the C/Ta ratio is controlled by changing the supply of $TaCl_5$ gas to gradually increase within the range of from 0.01 to 20 cc/min, while supplying $C_3H_8$ gas at a flow rate of 200-400 cc/min, hydrogen gas at a flow rate of 100-2000 cc/min and argon gas at a flow rate of 2000-5000 cc/min, during the CVD treatment. An appropriately combination of CVD conditions such as the temperature, pressure, each gas flow rate, treatment time and the like enables control of the growth rate to 1-50 μm/hr, which in turn affords an intermediate layer 23 having a desired thickness. After formation of the intermediate layer 23, the coating film 3 of tantalum carbide can be successively formed.

EXAMPLES

The present invention is explained in more detail in the following by referring to Examples, which are not to be construed as limitative.

The test method of the resistance to thermal shock under a reducing gas atmosphere is first shown. There are two kinds of methods for a thermal shock test, including a test imitating general epitaxial growth: <thermal shock test 1> and a test assuming strict conditions: <thermal shock test 2>. The <thermal shock test 2> requires far stricter conditions than the general use, and a carbon material that does not develop cracks and the like in this test is considered to have highly superior properties. Even if a carbon material develops cracks and the like in the <thermal shock test 2>, if it does not develop cracks and the like in the <thermal shock test 1>, the material can be considered to sufficiently provide the effect of the present invention.

The vacuum furnace is a high frequency induction heating furnace equipped with a quartz tube as a reaction chamber, and a carbon material 100 is set in the inside of the reaction chamber. After reducing the pressure in the reaction chamber to not more than 0.01 Torr, a mixed gas of hydrogen (3000 cc/min) and ammonia (500 cc/min) is supplied into the reaction chamber and the pressure is controlled to 760 Torr.

In the <thermal shock test 1>, a carbon material is heated to 1500° C. by induction heating at a temperature rise rate of 150° C./min. Then, the carbon material is maintained at 1500° C. for 3 hr. Thereafter, the material is cooled to room temperature at a temperature decrease rate of 300° C./min. With the above as one cycle, 100 cycles (total about 300 hr) thereof are performed.

In the <thermal shock test 2>, the carbon material 100 is heated to 1500° C. by induction heating at a temperature rise rate of 1000° C./min. Then, the carbon material 100 is maintained at 1500° C. for 3 hr. Thereafter, the material is cooled to room temperature at a temperature decrease rate of 300° C./min. With the above as one cycle, 1000 cycles (total about 3000 hr) thereof are performed.

Examples 1-3

Figure 15:
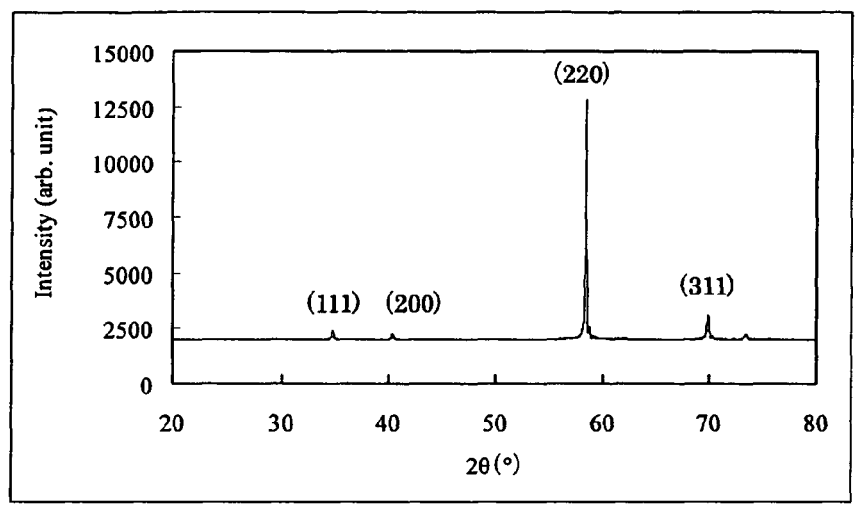
FIG. 15-FIG. 17 show X-ray diffraction patterns of the coating films obtained in the present invention.
Figure 16:
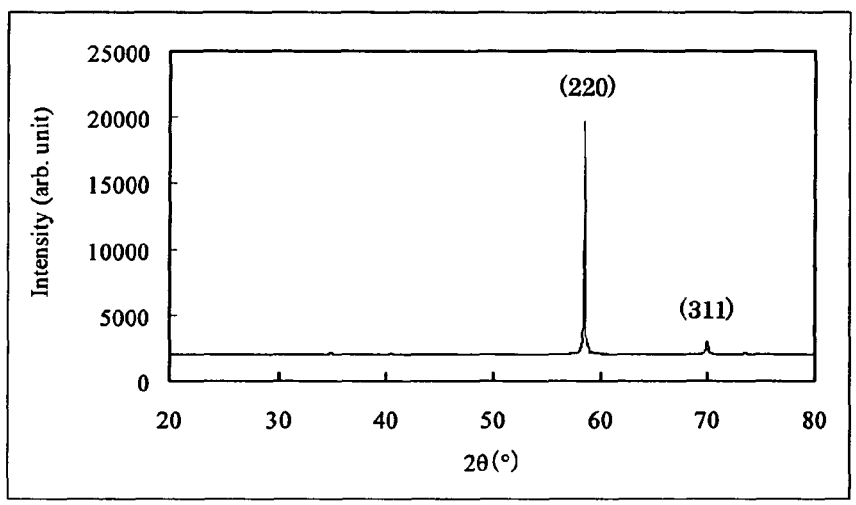
Figure 17:
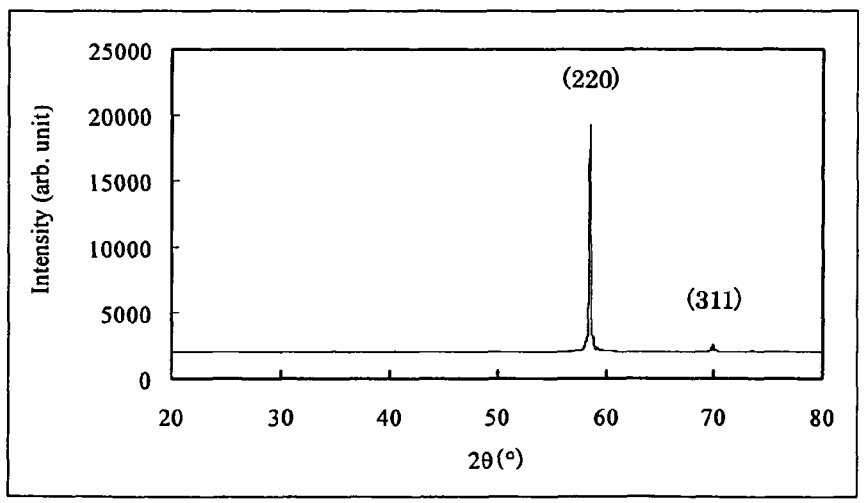

A graphite substrate having a diameter of 60 mm, a thickness of 10 mm, a thermal expansion coefficient of $7.8×10^{-6}$/K, a gas release pressure based on 1000° C. standard of $10^{-6}$ Pa/g, and an ash content of 2 ppm was subjected to the aforementioned halogen treatment, after which a tantalum carbide coating film was formed on the carbon substrate under the CVD conditions of the following Table 1. The C/Ta composition ratio then of the coating film was adjusted to 1.0-1.2 by a $C_3H_8$ flow rate. Using the CVD conditions shown in Table 1, the membrane thickness was changed to 21, 34, 44 μm by changing the reaction time to 11, 18, 25 hr. Thereafter, the crystallinity of the coating film 3 was further improved by applying a heat treatment at 2000° C. for 10 hr in a hydrogen gas atmosphere. The results of the X-ray diffraction of Examples 1-3 are shown in FIG. 15-FIG. 17. In the X-ray diffraction, a diffraction line of the (220) plane was mainly confirmed, and the diffraction lines of the (111), (200), (311) planes were slightly confirmed. Specifically, the diffraction line of the (220) plane showed the highest diffraction intensity, and the half value width of the (220) plane was 0.13-0.15. The intensity ratio of (220) and the second highest (311) as expressed by the diffraction line intensity ratio was not less than 10 (Example 1). As shown in Table 2, the gas permeability after the <thermal shock test 1> in a reducing gas atmosphere of hydrogen and ammonia gas was $5×10^{-10}$-$2×10^{-7}$ $cm^2$/sec. The gas permeability after the <thermal shock test 2> was $4×10^{-10}$-$2×10^{-7}$ $cm^2$/sec. Thus, the coating film 3 where the (220) plane showed the highest diffraction intensity was dense and superior in gas impermeability.

Comparative Examples 1-3

Figure 18:
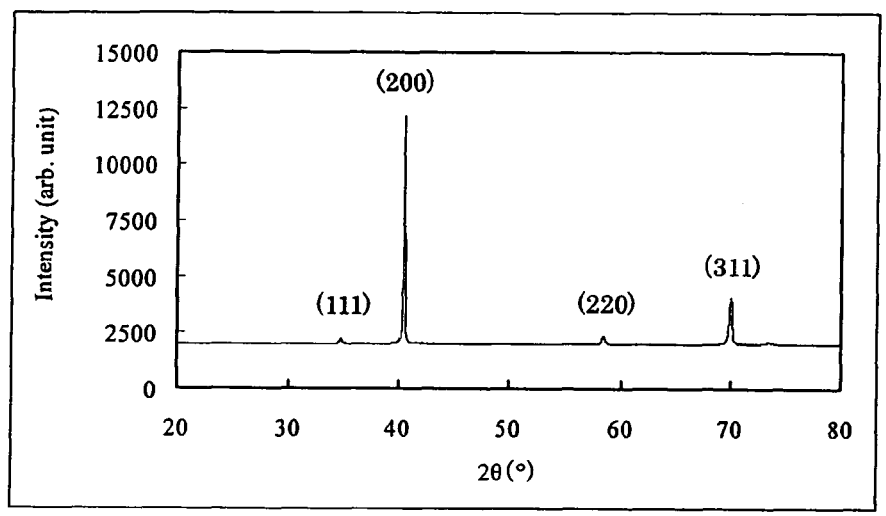
FIG. 18-FIG. 20 show X-ray diffraction patterns of the coating films of Comparative Examples.
Figure 19:
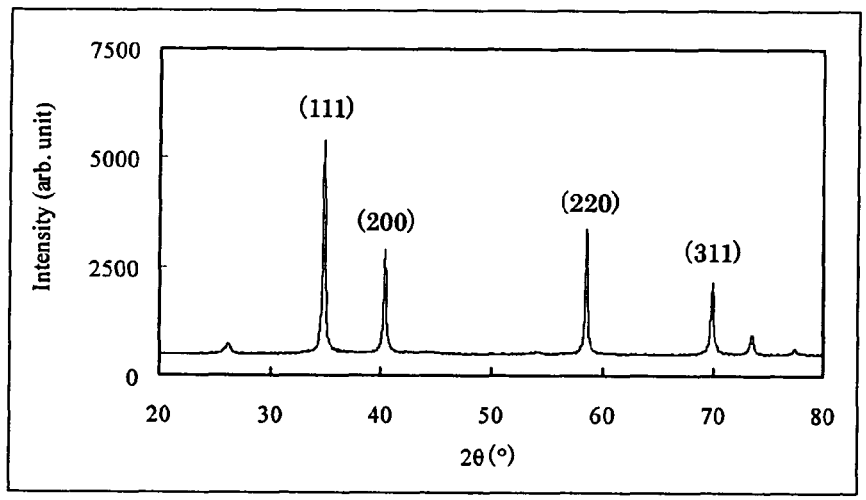
Figure 20:
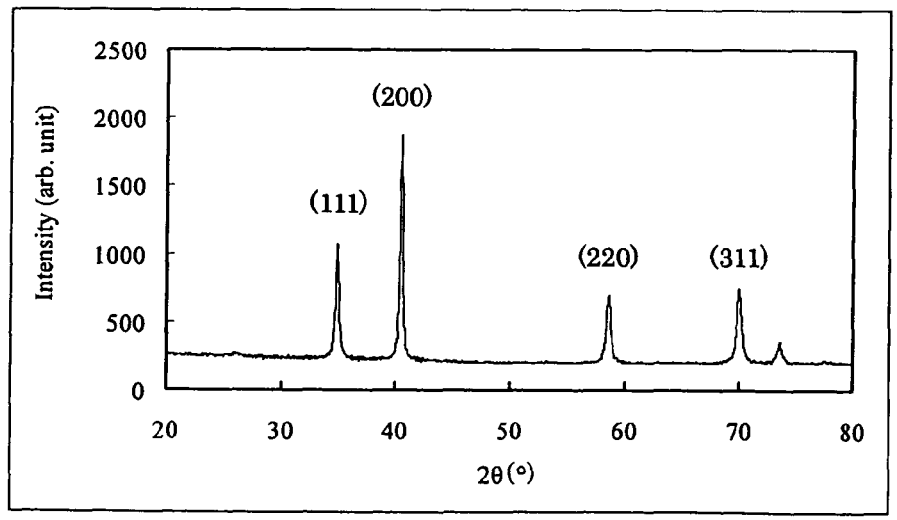
Figure 21:
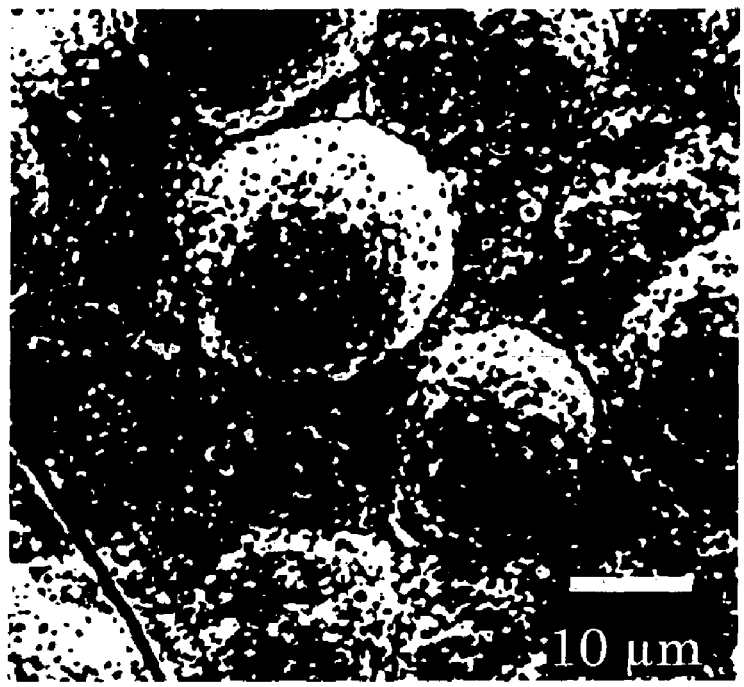
FIG. 21 and FIG. 22 show microscopically observed images of the coating films obtained in the art.
Figure 22:
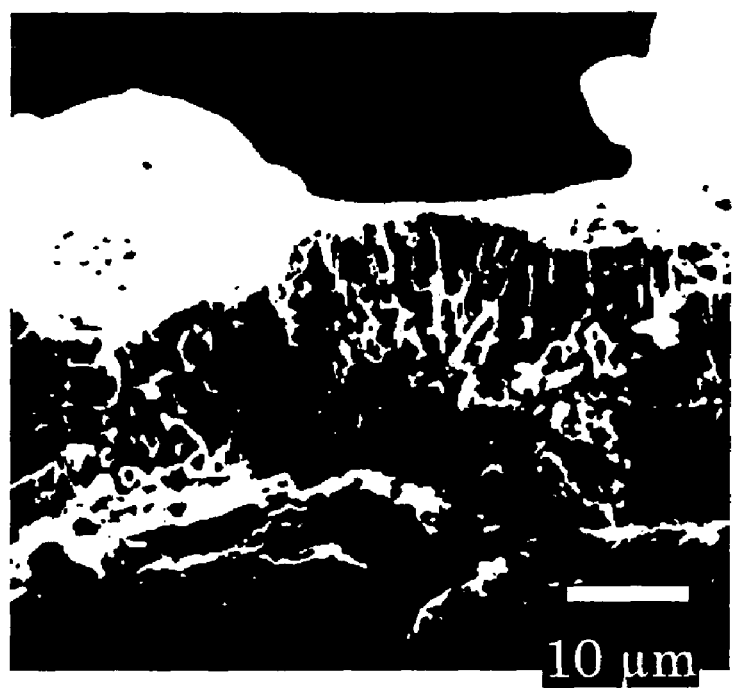

In the same manner as in Examples 1-3 except that the conditions of the CVD were changed to those shown in Table 1, and the heat treatment after formation of the coating film was omitted, a carbon material was similarly produced. The results of the X-ray diffraction of Comparative Examples 1-3 are shown in FIG. 18-FIG. 20. Different from Examples 1-3, a profile showing high diffraction lines of the (200) plane and the (111) plane was obtained. In this case, cracks were developed in the tantalum carbide coating film after coating, as shown in Table 2, the gas permeability after the <thermal shock test 1> wherein hydrogen and ammonia gas were mixed was $2×10^{-5}$-$9×10^{-5}$ $cm^2$/sec, the gas permeability after the <thermal shock test 2> was $2×10^{-4}$-$7×10^{-4}$ $cm^2$/sec, lacking the dense property, and a weight decrease was confirmed by a gasification reaction of the graphite substrate. All cases where the tantalum carbide crystal was not mainly oriented to the (220) plane as in the above showed inferior dense property.

TABLE 1

| | reaction conditions | | | | | | reaction |
|---|---|---|---|---|---|---|---|
| | temperature | pressure | gas flow rate (cc/min) | | | | time |
| | (° C.) | (Pa) | $TaCl_5$ | $C_3H_8$ | $H_2$ | Ar | (hr) |
| Ex. 1 | 850 | 1330 | 20 | 250 | 1000 | 4000 | 11 |
| Ex. 2 | 850 | 1330 | 20 | 250 | 1000 | 4000 | 18 |
| Ex. 3 | 850 | 1330 | 20 | 250 | 1000 | 4000 | 25 |
| Comp. Ex. 1 | 950 | 2000 | 20 | 250 | 1000 | 4000 | 16 |
| Comp. Ex. 2 | 900 | 1330 | 20 | 250 | 1000 | 4000 | 18 |
| Comp. Ex. 3 | 800 | 3200 | 20 | 250 | 1000 | 4000 | 25 |

TABLE 2

| | TaC film thickness (μm) | before thermal shock test | | | after thermal shock test 1 | | | after thermal shock test 2 | | |
|---|---|---|---|---|---|---|---|---|---|---|
| | | X-ray diffraction intensity ratio (220)/(311) | half value width of the highest diffraction line (°) | gas permeability ($cm^2/s$) presence or absence of crack or delamination | X-ray diffraction intensity ratio (220)/(311) | half value width of the highest diffraction line (°) | gas permeability ($cm^2/s$) presence or absence of crack or delamination | X-ray diffraction intensity ratio (220)/(311) | half value width of the highest diffraction line (°) | gas permeability ($cm^2/s$) presence or absence of crack or delamination |
| Ex. 1 | 21 | 10 | 0.14 (220) plane | $2 \times 10^{-7}$ absent | 10 | 0.14 (220) plane | $2 \times 10^{-7}$ absent | 12 | 0.14 (220) plane | $2 \times 10^{-7}$ absent |
| Ex. 2 | 34 | 18 | 0.13 (220) plane | $3 \times 10^{-9}$ absent | 18 | 0.13 (220) plane | $3 \times 10^{-9}$ absent | 22 | 0.13 (220) plane | $5 \times 10^{-9}$ absent |
| Ex. 3 | 44 | 35 | 0.15 (220) plane | $5 \times 10^{-10}$ absent | 35 | 0.15 (220) plane | $5 \times 10^{-10}$ absent | 31 | 0.14 (220) plane | $4 \times 10^{-10}$ absent |
| Comp. Ex. 1 | 42 | 0.2 | 0.15 (200) plane | $1 \times 10^{-5}$ present | 0.2 | 0.15 (200) plane | $2 \times 10^{-5}$ present | 0.1 | 0.10 (200) plane | $5 \times 10^{-4}$ present |
| Comp. Ex. 2 | 45 | 2 | 0.25 (111) plane | $2 \times 10^{-5}$ present | 2 | 0.25 (111) plane | $9 \times 10^{-5}$ present | 3 | 0.19 (111) plane | $2 \times 10^{-4}$ present |
| Comp. Ex. 3 | 42 | 1 | 0.30 (200) plane | $1 \times 10^{-5}$ present | 1 | 0.30 (200) plane | $5 \times 10^{-5}$ present | 1 | 0.15 (111) plane | $7 \times 10^{-4}$ present |

Examples 4-8

A coating film 3 of tantalum carbide was formed by the CVD method on the carbon substrate 1 similar to the one used in Examples 1-3. As the CVD conditions, the temperature was constantly maintained at 850° C. and the pressure at 1330 Pa, and the tantalum carbide growth rate was changed within the range of 1-30 μm/hr by changing the flow rate of $C_3H_8$ and $TaCl_5$. In Examples 4-6, after formation of the coating film 3, a heat treatment was applied in a hydrogen gas atmosphere at 2000° C. for 10 hr. The crystal structure of the obtained coating film 3 was examined by X-ray diffraction. As a result, the intensity ratio of the diffraction line of the (220) plane was the highest, and not less than 4 times the intensity of the second highest diffraction line. As shown in Table 3, the half value width of the diffraction line of the (220) plane of the coating film 3 was within the range of 0.11-0.14°. Such coating films were all free of cracks and delamination and superior before the thermal shock test under a reducing gas atmosphere. In particular, a coating film showing a small half value width of not more than 0.2° was free of cracks and delamination and extremely superior even after the <thermal shock test 1> and the <thermal shock test 2> under very strict conditions.

In Examples 7-8, the coating film 3 of tantalum carbide was formed by the CVD method on the carbon substrate 1 similar to the one used in Examples 1-3. As the CVD conditions, the temperature was constantly maintained at 850° C. and the pressure at 1330 Pa, and the tantalum carbide growth rate was changed within the range of 31-50 μm/hr by changing the flow rate of $C_3H_8$ and $TaCl_5$. In Examples 7-8, the heat treatment in a hydrogen gas atmosphere was omitted. The crystal structure of the obtained the coating film 3 was examined by X-ray diffraction. As a result, the intensity ratio of the diffraction line of the (220) plane was the highest. However, the growth level (crystallinity) changed as shown in Table 3, since the growth rate was changed, and the half value width was 0.31-0.75°. The coating films of Examples 7-8 having a high half value width showed an increase in the gas permeability (Example 8) after the <thermal shock test 2> under very strict conditions, but are superior coating films free of cracks and delamination after the <thermal shock test 1>, which showed the quality free of practical problems.

TABLE 3

| | crystal face of diffraction line with highest intensity | half value width of the diffraction line (°) with highest intensity | before thermal shock test gas permeability ($cm^2/s$) presence or absence of crack or delamination | after thermal shock test 1 gas permeability ($cm^2/s$) presence or absence of crack or delamination | after thermal shock test 2 gas permeability ($cm^2/s$) presence or absence of crack or delamination |
|---|---|---|---|---|---|
| Ex. 4 | (220) plane | 0.11 | $1 \times 10^{-9}$ absent | $1 \times 10^{-9}$ absent | $1 \times 10^{-9}$ absent |
| Ex. 5 | (220) plane | 0.15 | $5 \times 10^{-9}$ absent | $5 \times 10^{-9}$ absent | $3 \times 10^{-9}$ absent |
| Ex. 6 | (220) plane | 0.14 | $4 \times 10^{-9}$ absent | $4 \times 10^{-9}$ absent | $8 \times 10^{-10}$ absent |
| Ex. 7 | (220) plane | 0.31 | $5 \times 10^{-9}$ absent | $5 \times 10^{-9}$ absent | $1 \times 10^{-6}$ absent |
| Ex. 8 | (220) plane | 0.75 | $8 \times 10^{-9}$ absent | $8 \times 10^{-9}$ absent | $8 \times 10^{-4}$ present |

Examples 9-18

Using various graphite substrates 1 having the properties described in Table 4, carbon materials 100 were produced. The aforementioned halogen treatment was applied to the graphite substrate (diameter 60 mm, thickness 10 mm) having various thermal expansion coefficients (CTE) described in Table 4, and the ash content of the graphite substrate was set to not more than 10 ppm. In Example 18, the halogen treatment was omitted and the ash content of the graphite substrate 1 was 16 ppm. Under similar conditions as in Examples 1-3, a coating film 3 of tantalum carbide (thickness 43 μm) was formed on the substrate. The C/Ta composition ratio of the coating film 3 was adjusted to 1.0-1.2 by the $C_3H_8$ flow rate. After forming the coating film 3, a heat treatment was applied in a hydrogen gas atmosphere at 2000° C. for 10 hr. All the coating films of Examples 9-18 showed the highest diffraction intensity in the (220) plane, which was not less than 4 times the intensity of the second highest diffraction line, and the half value width of the (220) plane was not more than 0.2°. As shown in Table 4, all carbon materials 100 were free of cracks and delamination after the <thermal shock test 1> and were confirmed to be superior materials.

TABLE 4

| | properties of graphite substrate | | | | after thermal shock test 1 gas permeability ($cm^2/s$) presence or absence of crack or delamination |
|---|---|---|---|---|---|
| | bulk density ($Mg/m^3$) | bending strength (MPa) | CTE* ($\times 10^{-6}$/K) | ash content (ppm) | |
| Ex. 9 | 1.90 | 93.1 | 6.5 | 8 | $1 \times 10^{-10}$ absent |
| Ex. 10 | 1.80 | 68.8 | 7.2 | 7 | $2 \times 10^{-10}$ absent |
| Ex. 11 | 1.82 | 69.6 | 7.8 | 3 | $6 \times 10^{-11}$ absent |
| Ex. 12 | 1.81 | 69.1 | 8.6 | 8 | $2 \times 10^{-11}$ absent |
| Ex. 13 | 1.84 | 70.0 | 9.0 | 5 | $3 \times 10^{-10}$ absent |
| Ex. 14 | 1.88 | 92.5 | 6.0 | 6 | $8 \times 10^{-9}$ absent |
| Ex. 15 | 1.91 | 93.0 | 6.4 | 6 | $1 \times 10^{-9}$ absent |
| Ex. 16 | 1.81 | 69.3 | 9.1 | 7 | $6 \times 10^{-9}$ absent |
| Ex. 17 | 1.84 | 71.1 | 9.5 | 8 | $6 \times 10^{-9}$ absent |
| Ex. 18 | 1.83 | 72.5 | 7.8 | 16 | $3 \times 10^{-9}$ absent |

*) The measurement temperature range was 293-1273K.

Further Examples are shown in the following. The evaluation methods employed in the following Examples are explained.

Microscopic Observation

The surface of the produced carbon materials 100 was observed with a scanning electron microscope (SEM), and the presence or absence of the cracks and delamination was evaluated. The thickness of the intermediate layer 2 was measured by the observation of the section using SEM. The SEM apparatus used was S-3200N of Hitachi, Ltd. The secondary electron image (SEI) and backscattered electron image (BEI) of the section after cleavage and grinding were determined. In particular, the element dependency can be utilized according to the backscattered electron image and, consequently, the chemical composition of the observed plane can be comprehended two-dimensionally. As a result, the chemical composition distribution of the intermediate layer 2 becomes evident. Utilizing this, conversion and impregnation depth of tantalum carbide were evaluated with a particular attention paid to carbon and tantalum carbide.

X-ray Analysis

Furthermore, by a sectional observation using an X-ray microanalyzer (XMA), the conversion and impregnation depth of tantalum carbide, and the thickness of the gradient material layer were measured. The XMA apparatus used was EMAX-7000 of Horiba, Ltd. The molar ratio of carbon and tantalum particular on-line analysis of the section after cleavage and grinding was measured, and the depth of the intermediate layer and membrane thickness were evaluated.

Auger Electron Spectroscopy

By concurrently using the Auger electron spectroscopy (AES) and sputtering of noble gas, a depth direction analysis from the surface to the inside of the carbon substrate 1 was performed and the molar ratios of carbon and tantalum in the depth direction were measured, based on which the depth and membrane thickness of the intermediate layer 2 were evaluated. In the following Examples, Auger electron spectroscopy apparatus (PHI700 manufactured by ULVAC-PHI, Inc.) was used. According to the Auger electron spectroscopy, an electron beam is irradiated on the sample surface in high vacuum and the core electron of the atom of the sample surface is ejected. When an outer electron is supplied to the vacant orbital formed above, an electron is developed. The electron thus developed is called an Auger electron, where the kinetic energy of the Auger electron is specific to the element. By examining the kinetic energy, therefore, elemental analysis of the area from the surface to several nm can be performed.

Resistance to Thermal Shock Test

The test for the resistance to thermal shock in a reducing gas atmosphere in the following Examples was performed according to the steps of the aforementioned <resistance to thermal shock test 2>.

The cycle of temperature rise and high temperature was repeated for 1000-3000 cycles (total 1000-3000 hr). After these cycles, the aforementioned surface observation by SEM was performed, and the presence or absence of cracks and delamination of the coating film 3 of tantalum carbide was evaluated.

Examples 19-22

A graphite substrate 1 having a diameter of 60 mm, a thickness of 10 mm, a thermal expansion coefficient of $7.8 \times 10^{-6}$/K, a gas release pressure based on 1000° C. standard of $10^{-6}$ Pa/g, and an ash content of 2 ppm was subjected to the aforementioned halogen treatment, after which tantalum was applied to the carbon substrate 1 by the CVD method. As the CVD conditions here, the reaction temperature was 1250° C., the reaction pressure was 4.00 kPa, the supply amount of $TaCl_5$ gas was 20 cc/min, the supply amount of hydrogen gas was 1000 cc/min, and the supply amount of argon gas was 4000 cc/min. By changing the reaction time to 0.5-34 hr, the thickness of the tantalum coating, i.e., weight of tantalum to be applied was changed as shown in the following Table 5. Then, the substrate 1 was treated in an argon atmosphere of 101.3 kPa at 2200° C. for 20 hr. As a result, carbon on the surface of the graphite substrate 1 was reacted with penetrated tantalum to convert to tantalum carbide, and a porous tantalum carbide layer (intermediate layer 2) was formed. The thickness of the obtained intermediate layer 2 was as shown in Table 5. Thereafter, a dense the coating film 3 of tantalum carbide having a C/Ta composition ratio of 1-1.2 and a thickness of 42 μm was formed on the intermediate layer 2 by the CVD method. As the CVD conditions here, the reaction temperature was 850° C., the reaction pressure was 1.33 kPa, the supply amount of $TaCl_5$ gas was 20 cc/min, the supply amount of $C_3H_8$ gas was 250 cc/min, the supply amount of hydrogen gas was 1000 cc/min, and the supply amount of argon gas was 4000 cc/min. Thereafter, the substrate 1 was subjected to a heat treatment in a hydrogen atmosphere at 2000° C. for 10 hr to give a carbon material 100.

The obtained carbon material 100 was subjected to the above-mentioned resistance to thermal shock test. All the samples were subjected to the 1000-cycle test, after which the cycles were repeated until the cracks and delamination are developed on the coating film 3. When the coating film 3 did not develop cracks and delamination up to 3000 cycles, the test was stopped at that time point. As is clear from the test results summarized in Table 5, the coating film of carbon material 100 with an intermediate layer 2 was firm. The crystal structure of the obtained the coating film 3 of Example 19 was examined by X-ray diffraction. As a result, the intensity ratio of the diffraction line of the (220) plane was the highest, and about 310 times the intensity of the second highest diffraction line, and the half value width of the (220) plane was about 0.13°.

TABLE 5

|  | weight (g) of coated tantalum | temperature (° C.) for conversion | thickness (μm) of intermediate layer | crack · delamination (number of cycles) |
|---|---|---|---|---|
| Ex. 19 | 0.127 | 2200 | 1.5 | absent (3000) |
| Ex. 20 | 1.017 | 2200 | 12 | absent (3000) |
| Ex. 21 | 3.810 | 2200 | 45 | absent (3000) |
| Ex. 22 | 8.299 | 2200 | 98 | absent (3000) |

Examples 23-26

A graphite substrate 1 similar to the one used in Example 19 was subjected to the aforementioned halogen treatment, and tantalum was embedded in the pores on the surface graphite substrate 1 by the CVI method. As the CVI conditions, the reaction temperature was 800° C., the reaction pressure was 133.3 kPa, the supply amount of $TaCl_5$ gas was 20 cc/min, the supply amount of hydrogen gas was 1000 cc/min, and the supply amount of argon gas was 4000 cc/min. The tantalum embedding depth, or the weight of embedded tantalum, was changed as shown in the following Table 6 by changing the reaction time to 15-150 hr. Then, the substrate 1 was treated in an argon atmosphere at 101.3 kPa and 2200° C. for 20 hr. As a result, tantalum embeeded in the pores and the surrounding carbon are reacted to allow conversion to tantalum carbide, whereby an intermediate layer 2 having a structure where tantalum carbide is embeeded in a carbon matrix was formed. The thickness of the obtained intermediate layer 2 is as shown in Table 6. Thereafter, the CVD treatment of the intermediate layer 2 and heat treatment in the same manner as in Example 19 gave a carbon material 100 having the coating film 3 made of tantalum carbide.

The obtained carbon material 100 was subjected to a resistance to thermal shock test in the same manner as in Example 19. As is clear from the test results summarized in Table 6, the coating film 3 made of the carbon material 100 with the intermediate layer 2 was firm.

TABLE 6

|  | weight (g) of embedded tantalum | temperature (° C.) for conversion | thickness (μm) of intermediate layer | crack · delamination (number of cycles) |
|---|---|---|---|---|
| Ex. 23 | 0.358 | 2200 | 1 | absent (3000) |
| Ex. 24 | 2.293 | 2200 | 32 | absent (3000) |
| Ex. 25 | 5.088 | 2200 | 71 | absent (3000) |
| Ex. 26 | 7.166 | 2200 | 100 | absent (3000) |

Examples 27-30

A graphite substrate 1 similar to the one used in Example 19 was subjected to the aforementioned halogen treatment, and a gradient material layer 23 was formed on the graphite substrate 1 by the CVD method. As shown in Table 7, the gradient material layer 23 had a concentration gradient that continuously decreased the C/Ta ratio as the layer got away from the graphite substrate 1 side. As the CVD conditions here, the reaction temperature was 850° C., the reaction pressure was 1.33 kPa, the supply amount of $C_3H_8$ gas was 250 cc/min, the supply amount of hydrogen gas was 1000 cc/min, and the supply amount of argon gas was 4000 cc/min. Setting the reaction time to 1-9 hr, a 1-9 μm-thick intermediate layer was formed. In the CVD, the supply amount of $TaCl_5$ gas was changed to give a gradient material layer 23. For example, to afford a concentration gradient to change the C/Ta ratio from 1000 to 1, the flow rate of $TaCl_5$ gas was continuously increased from 0.02 to 20 cc/min in proportion to the reaction time. Thereafter, the CVD treatment of the intermediate layer 23 and heat treatment in the same manner as in Example 19 gave a carbon material 100 having the coating film 3 made of tantalum carbide.

The obtained carbon material 100 was subjected to a resistance to thermal shock test in the same manner as in Example 19. As is clear from the test results summarized in Table 7, the coating film 3 made of the carbon material with the intermediate layer 23 was firm.

TABLE 7

|  | thickness (μm) of gradient material layer | C/Ta ratio* | thickness (μm) of TaC coating film | crack · delamination (number of cycles) |
|---|---|---|---|---|
| Ex. 27 | 1 | 10 to 1 | 42 | absent (3000) |
| Ex. 28 | 3 | 100 to 1 |  | absent (3000) |
| Ex. 29 | 5 | 1000 to 1 |  | absent (3000) |
| Ex. 30 | 9 | 10 to 1 |  | absent (3000) |

*) maximum value and minimum value of C/Ta ratio of gradient material layer

This application is based on patent application Nos. 2005-36838, 2005-179866 and 2005-255744 filed in Japan, the contents of which are incorporated in full herein by this reference.

The invention claimed is:

1. A tantalum carbide-coated carbon material comprising a carbon substrate and a coating film formed on the aforementioned carbon substrate, wherein the coating film is made of tantalum carbide crystals specifically developed in the (220) plane of tantalum carbide as compared to other Miller planes, wherein the diffraction line of the (220) plane of tantalum carbide shows the maximum diffraction intensity in an X-ray diffraction pattern of the coating film.

2. The carbon material of claim 1, wherein, in the X-ray diffraction pattern of the coating film, the half value width of the diffraction line of the (220) plane of tantalum carbide is not more than 0.2°.

3. The carbon material of claim 1, wherein, in the X-ray diffraction pattern of the coating film, the diffraction line of the (220) plane of tantalum carbide shows not less than 4 times the intensity of a diffraction line showing the second highest diffraction intensity.

4. The carbon material of claim 1, wherein the coating film shows a nitrogen gas permeability of not more than $10^{-6}$ cm$^2$/sec.

5. The carbon material of claim 1, wherein the coating film has a thickness of 10-100 μm.

6. A method of producing a tantalum carbide-coated carbon material, which comprises subjecting a carbon substrate and a coating film formed on the aforementioned carbon substrate, which film is made of tantalum carbide crystals, wherein, in an X-ray diffraction pattern, the diffraction line of the (220) plane of tantalum carbide shows the maximum diffraction intensity, to a heat treatment at 1600-2400° C. to increase the crystallinity of tantalum carbide of the coating film.

7. A tantalum carbide-coated carbon material comprising a carbon substrate, an intermediate layer formed on the carbon substrate, which layer is made of a composition comprising carbon and tantalum, and a coating film formed on the intermediate layer, wherein the coating film is made of a composition comprising tantalum carbide, wherein, in an X-ray diffraction pattern of the coating film, the diffraction line of the (220) plane of tantalum carbide shows the maximum diffraction intensity.

8. The carbon material of claim 7, wherein the intermediate layer has a more non-uniform chemical composition distribution than the coating film.

9. The carbon material of claim 8, wherein the intermediate layer is obtained by embedding tantalum carbide in the pores on the surface of the carbon substrate.

10. The carbon material of claim 7, wherein the intermediate layer is more porous than the coating film.

11. The tantalum carbide-coated carbon material of claim 10, wherein the intermediate layer is a porous layer obtained by converting the surface of the carbon substrate to tantalum carbide.

12. The carbon material of claim 7, wherein the intermediate layer is a gradient material layer having a concentration gradient, and the carbon/tantalum atomic ratio becomes continuously or stepwisely lower from the carbon substrate side to the coating film side.

13. The carbon material of claim 12, wherein the maximum value of the carbon/tantalum atomic ratio of the gradient material layer is not less than 10 and the minimum value thereof is 0.8-1.2.

14. The carbon material of claim 7, wherein the intermediate layer has a thickness of not less than 1 μm.

15. The carbon material of claim 7, wherein the coating film is a tantalum carbide film produced by chemical vapor deposition.

16. The carbon material of claim 7, wherein the carbon/tantalum atomic ratio of the coating film is 0.8-1.2.

17. The carbon material of claim 7, wherein, in the X-ray diffraction pattern of the coating film, the diffraction line of the (220) plane of tantalum carbide shows not less than 4 times the intensity of a diffraction line showing the second highest diffraction intensity.

18. The carbon material of claim 7, wherein, in the X-ray diffraction pattern of the coating film, the half value width of the diffraction line of the (220) plane of tantalum carbide is not more than 0.2°.

19. The carbon material of claim 7, wherein the coating film is obtained by subjecting a tantalum carbide film produced by chemical vapor deposition to a heat treatment at 1600-2000° C.

20. The carbon material of claim 7, wherein the thermal expansion coefficient of the coating film as measured by heating from 20° C. to 1000° C. is $6.9 \times 10^{-6}$-$7.8 \times 10^{-6}$/K.

* * * * *